United States Patent
Shiotsu et al.

(10) Patent No.: US 6,580,931 B1
(45) Date of Patent: Jun. 17, 2003

(54) PRINTED CIRCUIT BOARD INCLUDING EMI REDUCING CIRCUITS, AN INFORMATION PROCESSING APPARATUS HAVING THE BOARD AND A METHOD TO SELECT THE CIRCUITS

(75) Inventors: Shinichi Shiotsu, Kakogawa (JP); Akira Shiba, Kobe (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/233,181

(22) Filed: Jan. 20, 1999

(30) Foreign Application Priority Data

Apr. 10, 1998 (JP) .......................................... 10-098833

(51) Int. Cl.$^7$ ................................................ H04B 1/38
(52) U.S. Cl. ...................... 455/575; 455/117; 361/818; 361/736; 343/702
(58) Field of Search ........................... 455/575, 90, 117, 455/129, 347, 351, 269, 300, 336, 370, 334, 338; 343/702, 752, 848, 846, 847, 841; 361/736, 42

(56) References Cited

U.S. PATENT DOCUMENTS

| | | | | |
|---|---|---|---|---|
| 4,533,972 A | * | 8/1985 | Ohashi | 361/156 |
| 5,214,561 A | * | 5/1993 | Morita | 361/187 |
| 5,488,540 A | * | 1/1996 | Hatta | 361/794 |
| 5,517,063 A | * | 5/1996 | Schantz, Jr. et al. | 307/9.1 |
| 5,517,676 A | * | 5/1996 | Sekine et al. | 455/575 |
| 5,616,967 A | * | 4/1997 | Lee et al. | 307/42 |
| 5,631,659 A | * | 5/1997 | Evans et al. | 343/700 |
| 5,636,114 A | * | 6/1997 | Bhagwat et al. | 363/56 |
| 5,642,416 A | * | 6/1997 | Hill et al. | 379/416 |
| 5,764,491 A | * | 6/1998 | Tran | 361/794 |
| 5,767,817 A | * | 6/1998 | Tsuru et al. | 343/895 |
| 5,847,451 A | * | 12/1998 | Ohtaki et al. | 257/697 |
| 5,898,576 A | * | 4/1999 | Lockwood et al. | 361/782 |
| 5,917,722 A | * | 6/1999 | Singh | 363/132 |
| 5,946,609 A | * | 8/1999 | Morey | 455/336 |
| 5,949,197 A | * | 9/1999 | Kastner | 315/291 |
| 6,028,417 A | * | 2/2000 | Ang et al. | 323/209 |
| 6,043,724 A | * | 3/2000 | Frech et al. | 333/181 |
| 6,094,361 A | * | 7/2000 | Batten, Jr. et al. | 361/816 |
| 6,323,564 B1 | * | 11/2001 | Graf | 307/10.1 |

FOREIGN PATENT DOCUMENTS

JP 09266361 * 7/1997

OTHER PUBLICATIONS

Patent Abstracts of Japan, H09–266361, T. Itoh et al., Oct. 7, 1997, Whole Statement.

* cited by examiner

Primary Examiner—Dwayne Bost
Assistant Examiner—Joy K. Contee
(74) Attorney, Agent, or Firm—Staas & Halsey LLP

(57) ABSTRACT

A printed circuit board (PCB) has a plurality of electromagnetic interference (EMI) reducing circuits, which reduce electromagnetic waves emitted from the PCB, and a plurality of switching devices, such as MOS transistors, relays and DIP switches, to enable and disable the EMI reducing circuits. The EMI reducing circuits connected between border portions of a voltage and a ground layers in the PCB include at least a capacitor. A combination of the EMI reducing circuits which gives a minimum amount of electromagnetic waves emitted from an apparatus including the PCB is selected as a suitable combination of EMI reducing circuits. An information processing apparatus having the printed circuit boards has means for selecting a combination of the EMI reducing circuits which allow the minimum EMI emitted for the apparatus.

8 Claims, 21 Drawing Sheets

Figure 1A:
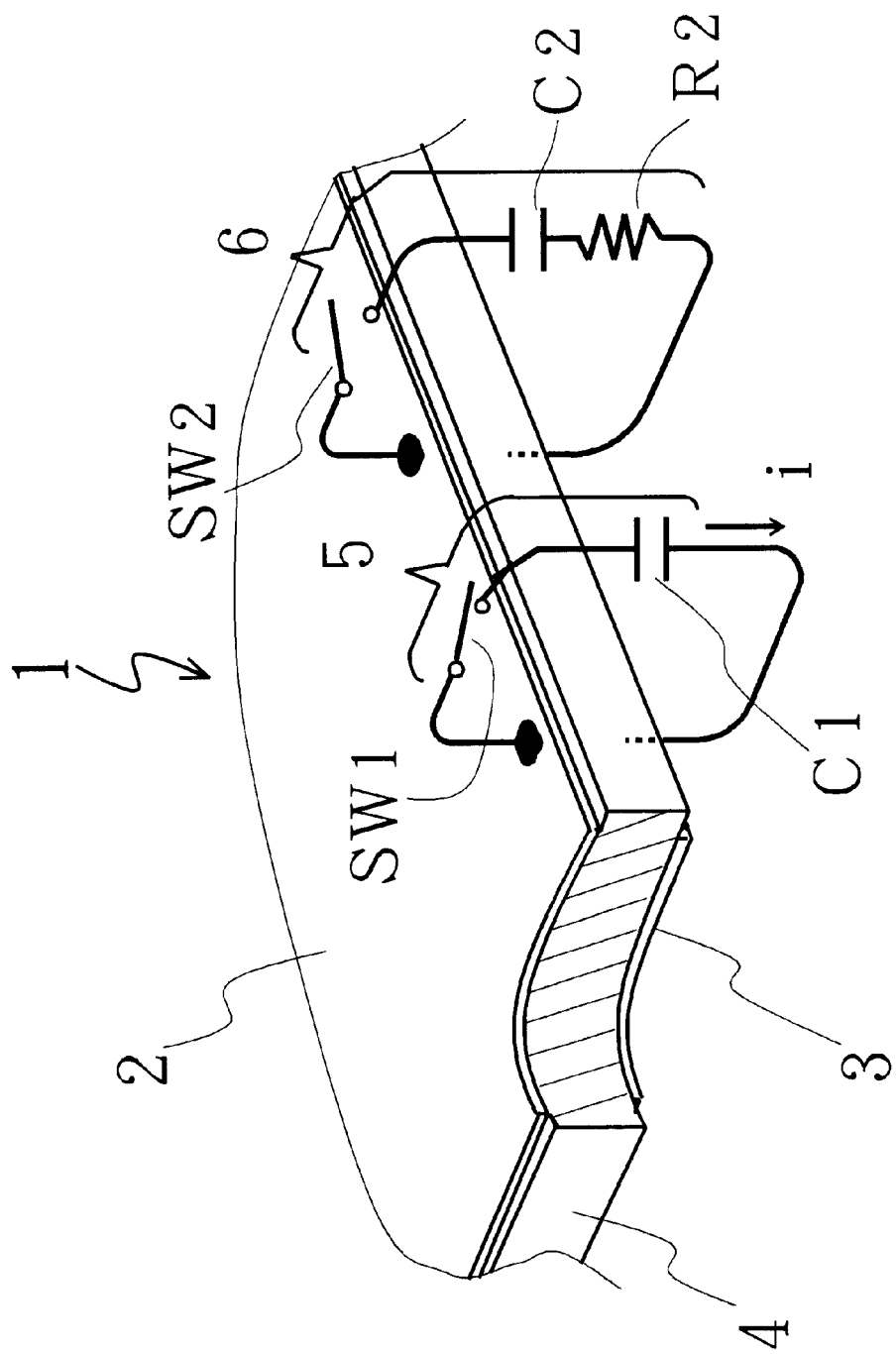

| P1 | P2 | P3 | P4 | P5 | P6 | RESISTANCE | CAPACITANCE |
|---|---|---|---|---|---|---|---|
| 1 | 0 | 0 | 0 | 0 | 0 | R16 | C16 |
| 1 | 1 | 0 | 0 | 0 | 0 | $\dfrac{R16 \times R17}{R16 + R17}$ | C16 |
| 0 | 0 | 1 | 0 | 0 | 0 | R18 | C18 |
| 0 | 0 | 1 | 1 | 0 | 0 | $\dfrac{R18 \times R19}{R18 + R19}$ | C18 |
| 0 | 0 | 0 | 0 | 1 | 0 | R20 | C20 |
| 0 | 0 | 0 | 0 | 1 | 1 | $\dfrac{R20 \times R21}{R20 + R21}$ | C20 |

FIG. 13

PRINTED CIRCUIT BOARD INCLUDING EMI REDUCING CIRCUITS, AN INFORMATION PROCESSING APPARATUS HAVING THE BOARD AND A METHOD TO SELECT THE CIRCUITS

BACKGROUND OF THE INVENTION

1. Field of the Invention

This invention relates to a printed circuit board having means for decreasing electromagnetic radiation emitted therefrom, an information processing apparatus having such printed circuit board(s), and a method for adjusting a suitable combination of the circuits arrangement to reduce the electromagnetic radiation.

More particularly this invention relates to decreasing electromagnetic radiation from mobile terminals, such as mobile computers and notebook computers, having a function of data communication with other facilities with a wireless interface.

2. Description of the Related Art

In recent years, higher performances of the apparatus need higher clock frequencies to operate CPU and electronic components in the apparatus. And the higher clock frequencies cause higher speed variations of voltage pulses between a voltage layer and a ground layer in printed circuit boards (PCBs) in the apparatus; and, therefore, electromagnetic radiation is radiated from the boards.

On the other hand, the development in computer downsizing has resulted in so called mobile computers, notebook computers, and laptop computers, which are easily carried. And these small sized computers can also communicate with other facilities with wireless interfaces. As these apparatus with wireless interface are particularly susceptible to the electromagnetic radiation emitted therefrom, it is very important to reduce the electromagnetic radiation.

As the electromagnetic radiation maybe cause erroneous operations in other nearby facilities, there are usually provided metallic shieldings covering the apparatus and containment arrangements on the PCBs to reduce the radiation. To more successful development in the apparatus, it is preferable to reduce the electromagnetic radiation from PCBs itself, because it is possible to reduce the electromagnetic radiation without increasing the metallic shielding structures, which adversely affect the computer downsizing.

One of the containment arrangements has been proposed in Japanese Patent Application No. 08-073987 (Unexamined Patent Publication No. 09-266361), where a PCB structure includes capacitors connected between a voltage layer and a ground layer at the border portion of the PCB. As the capacitors act as by-pass capacitors, the electromagnetic radiation caused from the voltage oscillation is reduced. In spite of preventing the electromagnetic radiation without affecting the scale of PCB's size, the prior art has traditional drawbacks described hereinafter, as the capacitance values and locations of the by-pass capacitors are fixed. That is, even in the prior art it must take labor-intensive practice to adjust in a short time the characteristics of circuits for the reducing electromagnetic radiation, according to the rapid progress of computers, such as adoption of higher operating frequency in CPU. After redesigns and trial productions, values of capacitors and their locations on PCBs are decided.

A conventional design method to prevent the electromagnetic radiation is a manner of a cut-and-try one. After a number of trials, metallic shielding structures or characteristics of electronic components such as capacitors used in the circuits preventing electromagnetic radiation are decided. This conventional design method takes long time troublesome working to decide specifications of parts and components, and it is necessary to redesign the circuits to reduce the electromagnetic radiation in almost every case of changing a design of apparatus or other circuit configuration.

As undesired electromagnetic radiation from electro-equipment result in electromagnetic interference ("EMI"), a circuit for reducing the electromagnetic radiation is referred to hereinafter designate as an "EMI reducing circuit."

SUMMARY OF THE INVENTION

An object of this invention is to provide a PCB having an improved arrangement of EMI reducing circuits each of which includes a circuit element for decreasing electromagnetic radiation form the PCB and a switching device selectively connecting the circuit element to a portion of a printed circuit pattern for enabling and disabling the circuit element. In preferred embodiment for the object of the present invention, the PCB has a plurality of EMI reducing circuits comprising a bypassing circuit or damping circuit, and a switching device. The switching device is connected to the bypassing circuit or the damping circuit, and is for enabling and disabling the bypassing circuit or the damping circuit.

Further object of this invention is to provide an information processing apparatus having a function minimized electromagnetic radiation. In preferred embodiment for the further object of the present invention, the apparatus has the above mentioned PCB and further comprises a memory device for storing information of a plurality of predetermined combination of the EMI reducing circuits to be enabled and disabled, and a control unit for transmitting signals to the EMI reducing circuits for opening or closing the switching devices corresponding to the information stored in the memory device.

Still another object of this invention is to provide a mobile terminal having the PCB(s) and a detachable wireless communication module. In preferred embodiment for the still another object of the present invention, the mobile terminal further includes the memory device, the control unit, a data storing device for storing original data, a comparing unit for obtaining a difference between the original data and a data received by the communication means by comparing these data, and a means for selecting a minimum difference out of a plurality of the differences and transmitting a data of the combination of the EMI reducing circuits resulting in the minimum difference to the control unit.

Still another object of this invention is to provide a method for adjusting a suitable combination of the circuit characteristics in a mobile terminal used for data communication. In preferred embodiment for the still another object of the present invention, the method for adjusting the EMI reducing circuits mounted on a printed circuit board comprises a step of composing a plurality of combination of the EMI reducing circuits to be enabled or disabled, a step of performing information processing in enabling the EMI reducing circuits in each of the combination, a step of measuring electromagnetic radiation emitted from the printed circuit board in performing the information processing, a step of comparing amounts of the electromagnetic radiation, a step of selecting a minimum amount out of the amounts, and a step of enabling the EMI reducing circuits of the selected combination resulting in the minimum amount.

A BRIEF DESCRIPTION OF THE DRAWINGS

Figure 1B:
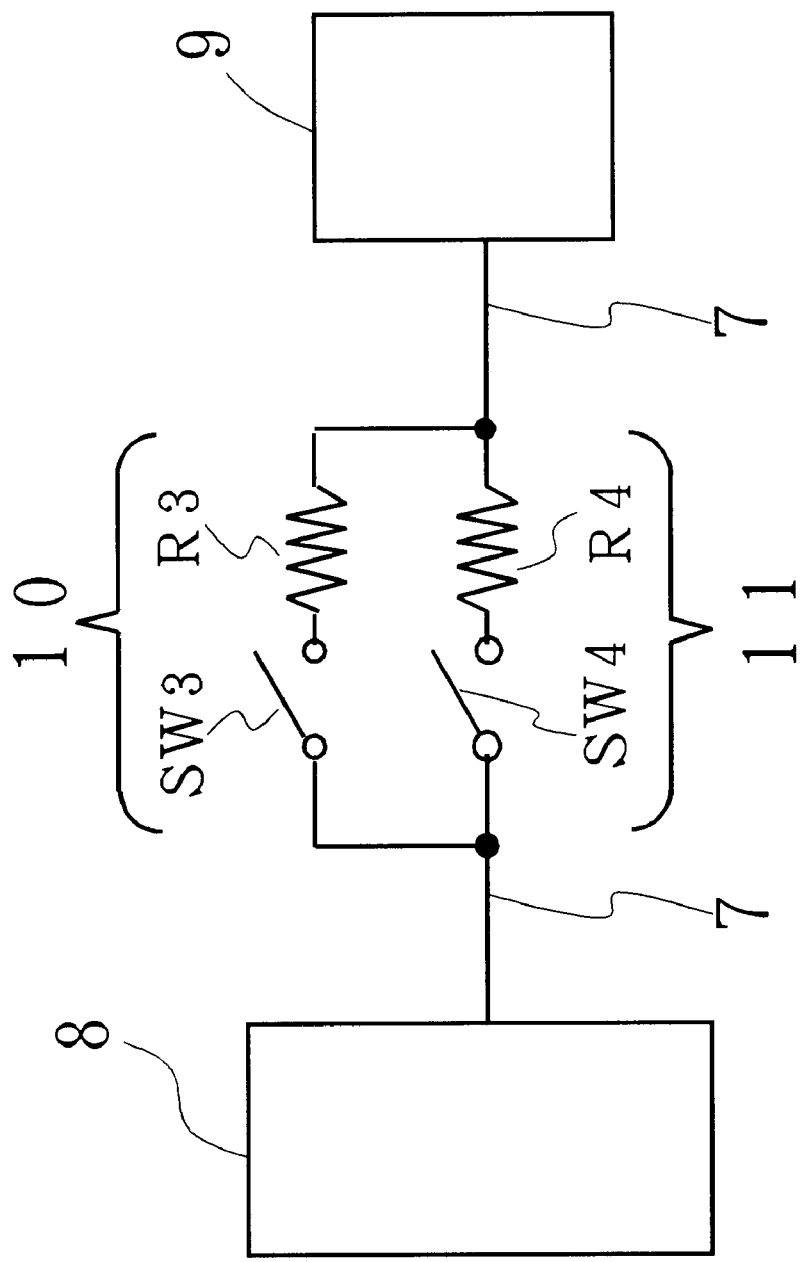
Figure 2B:
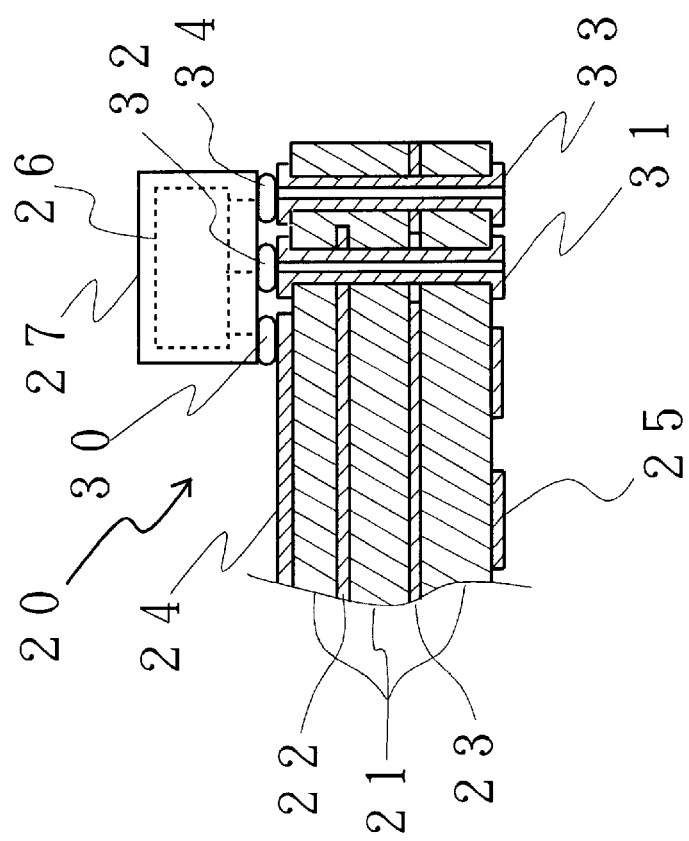
Figure 2A:
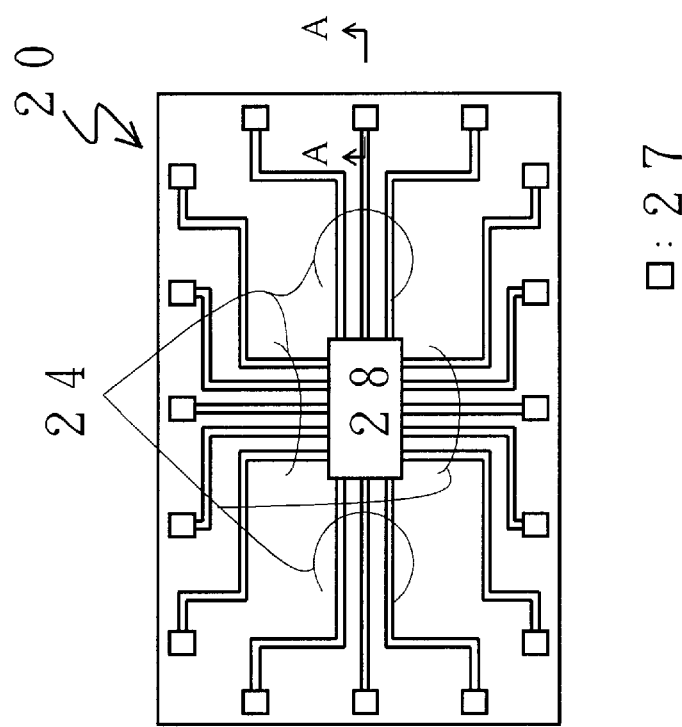
Figure 3:
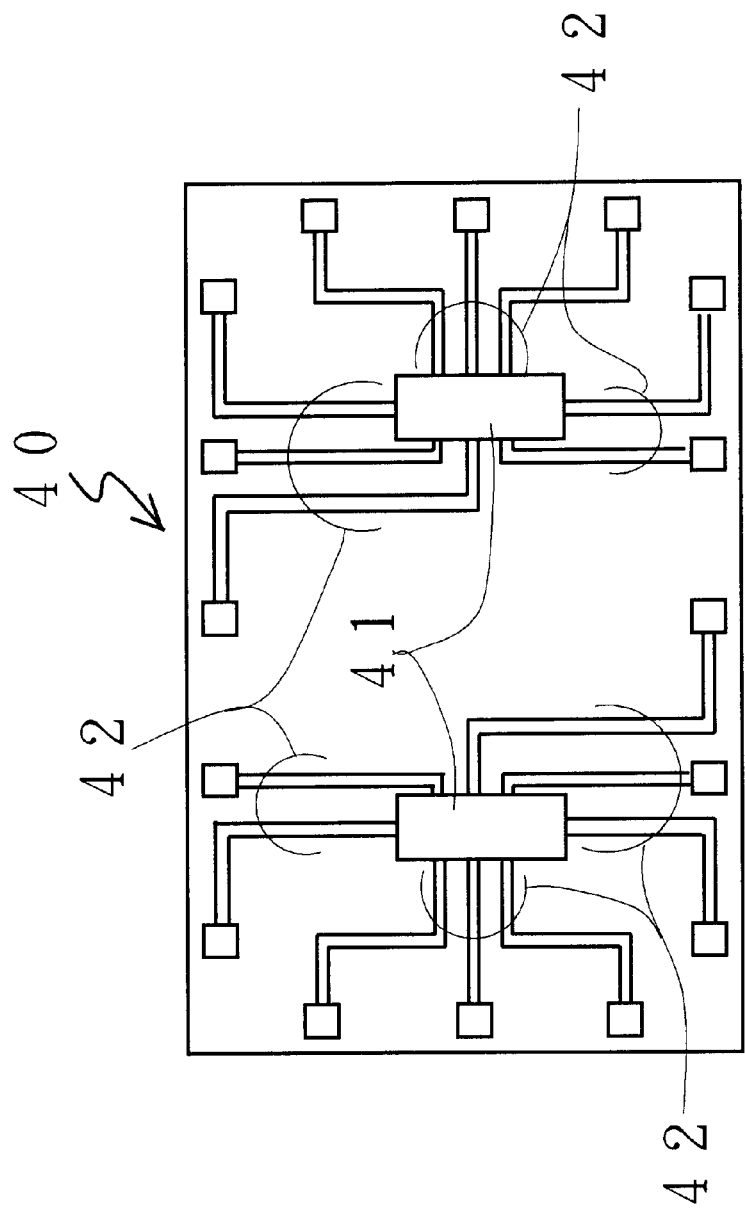
Figure 4:
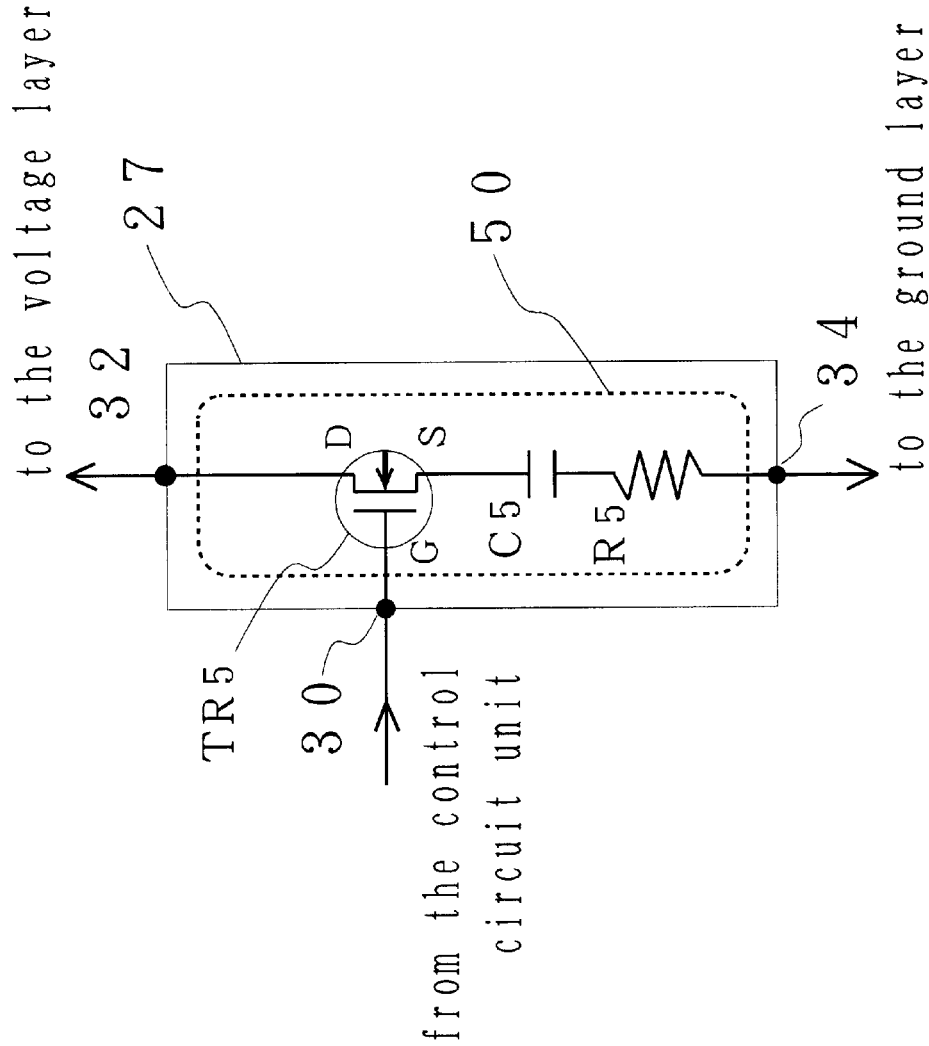
Figure 5:
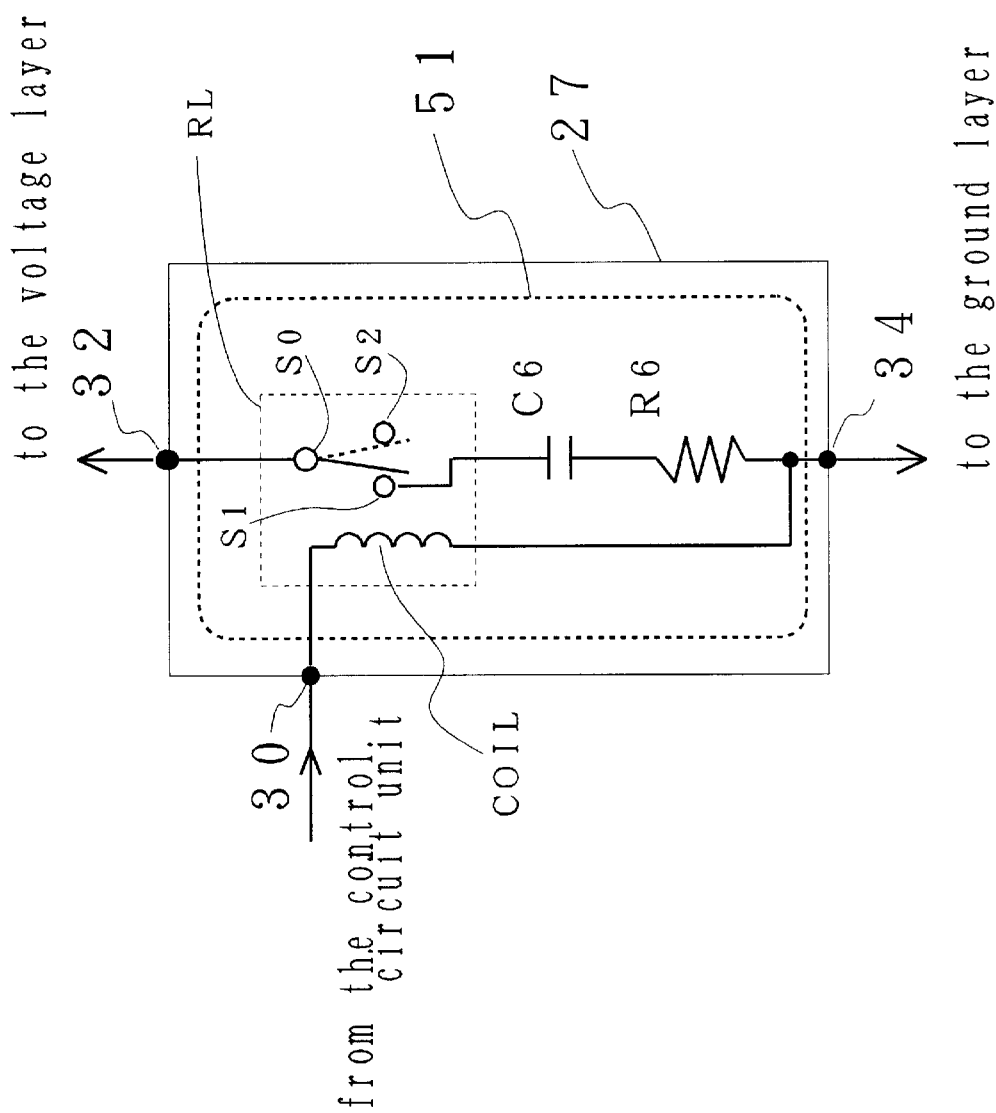
Figure 6:
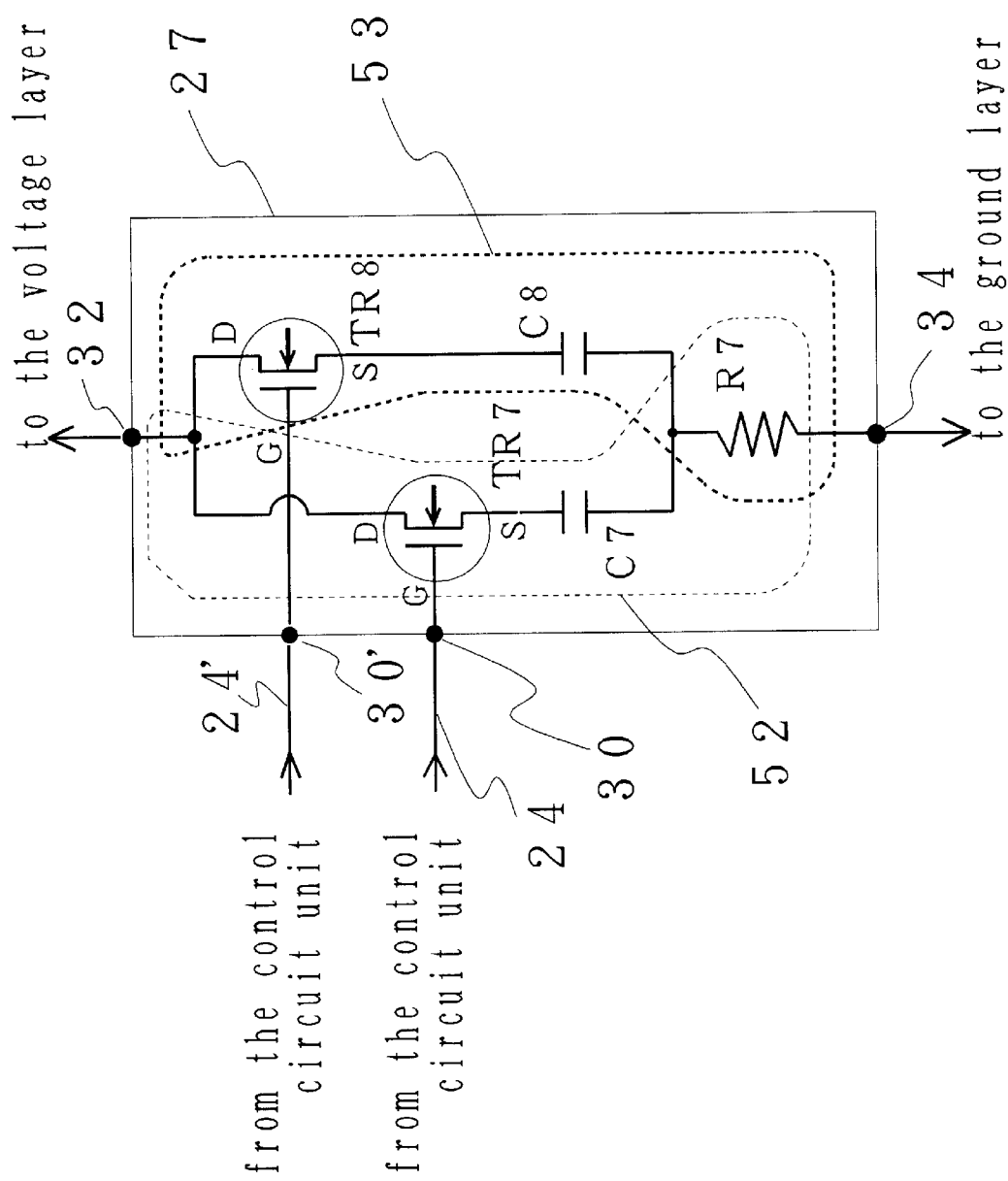
Figure 7:
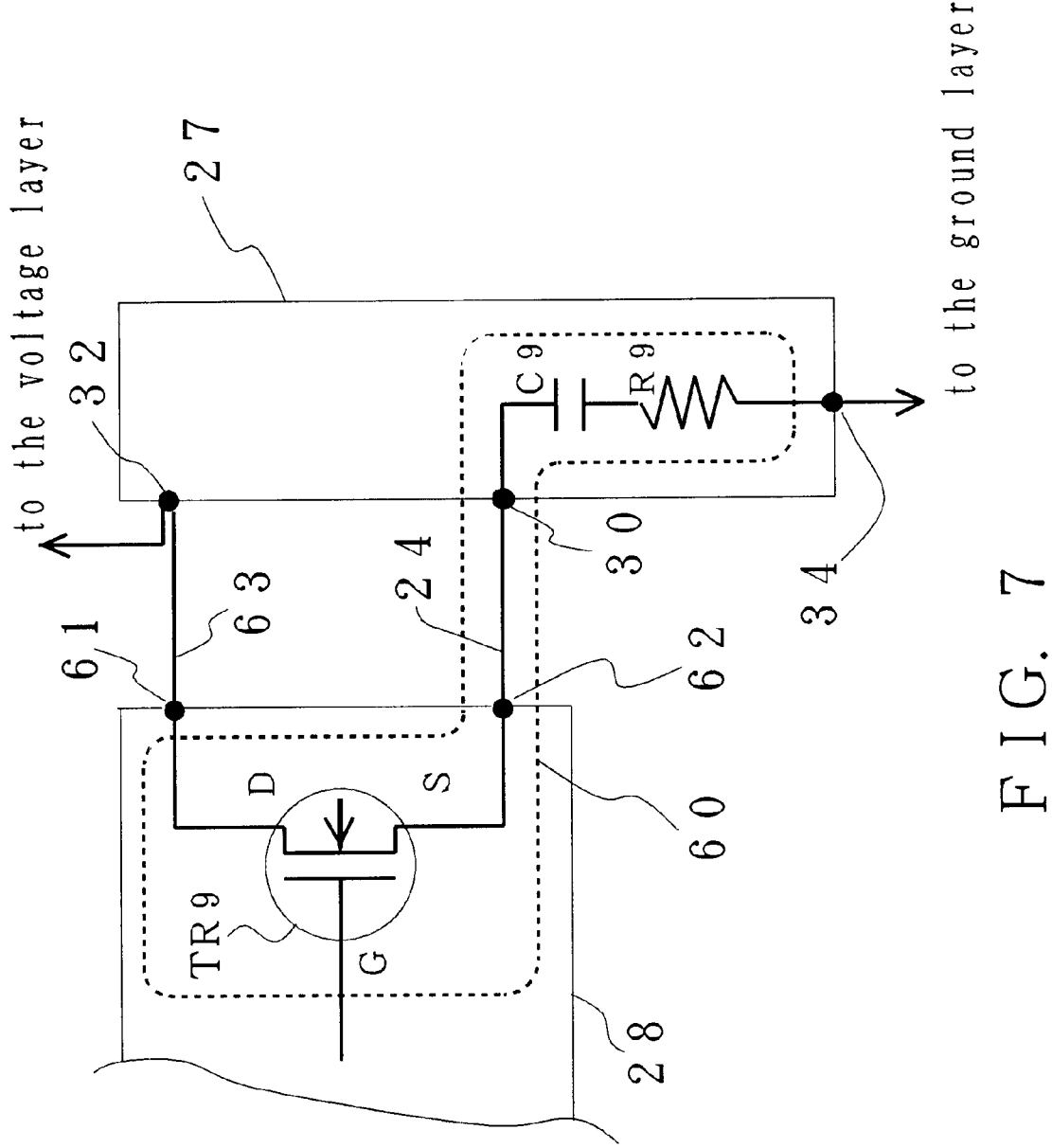
Figure 8:
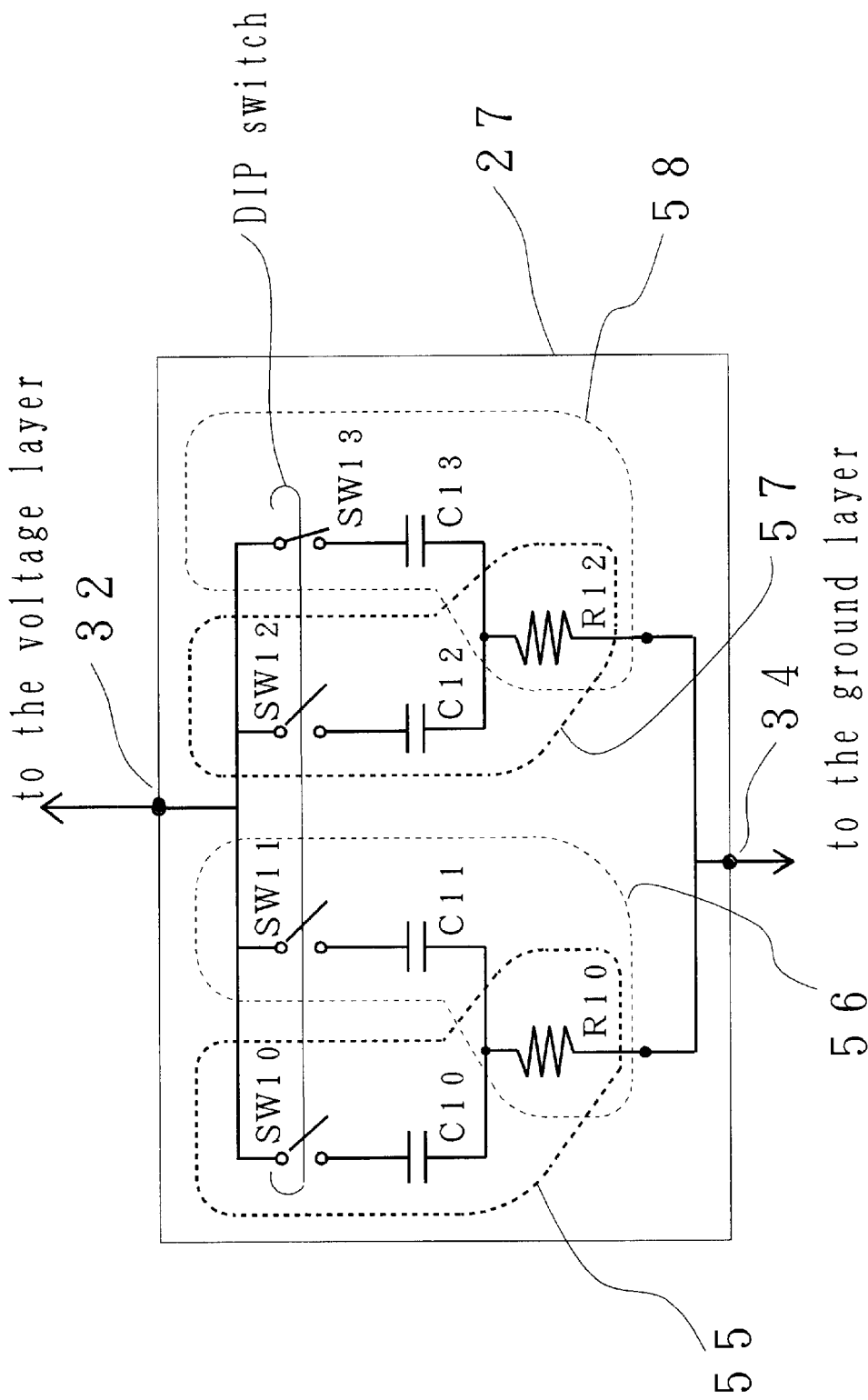
Figure 9:
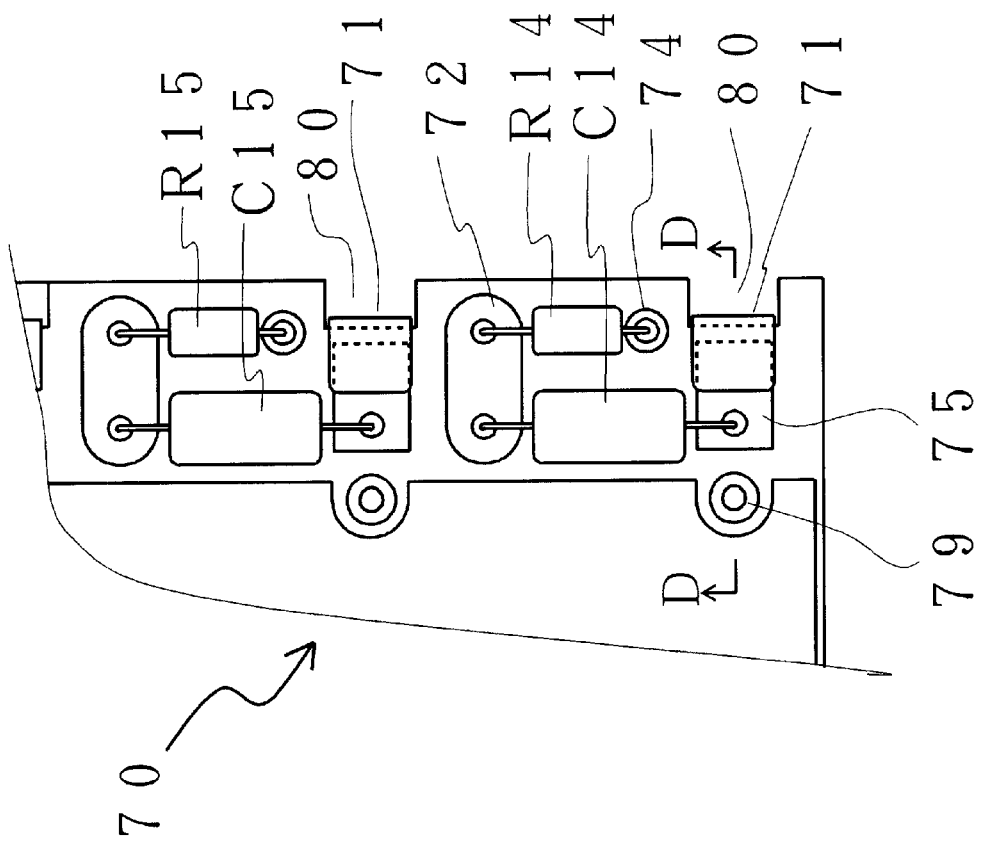
Figure 10:
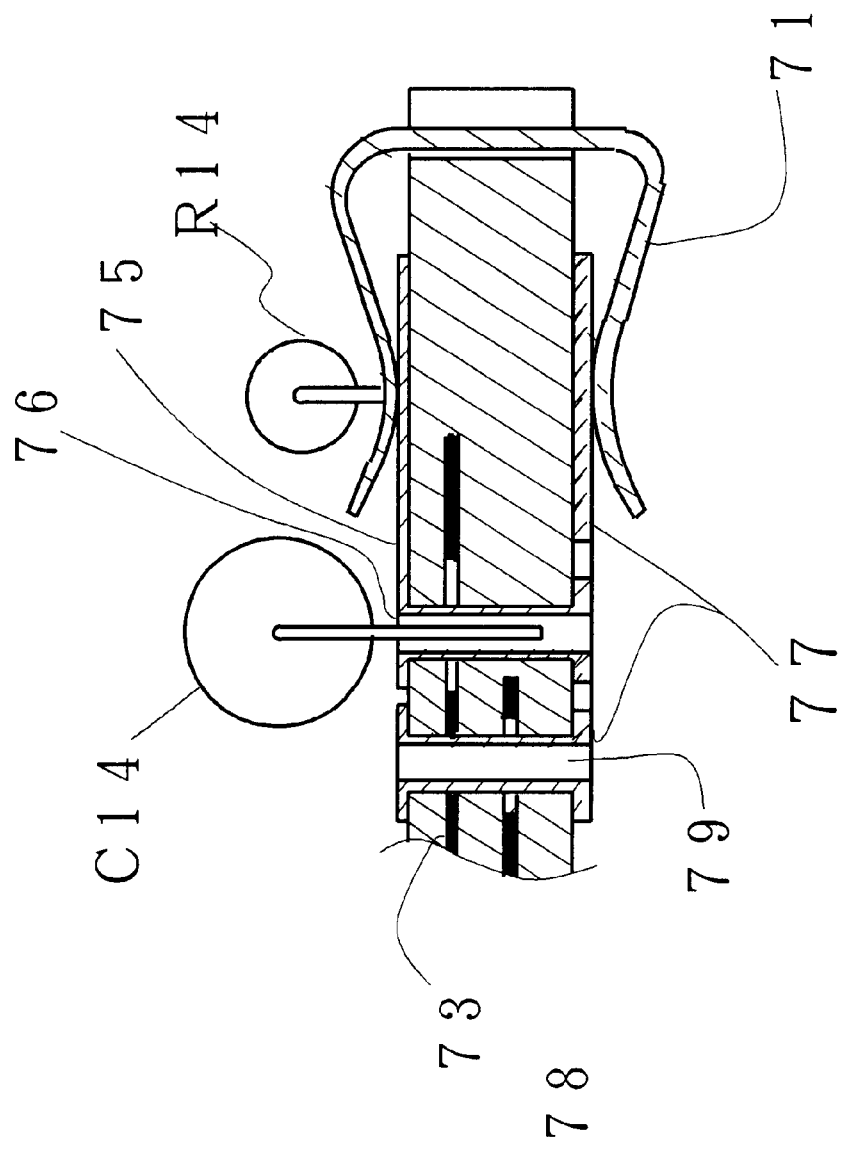
Figure 11A:
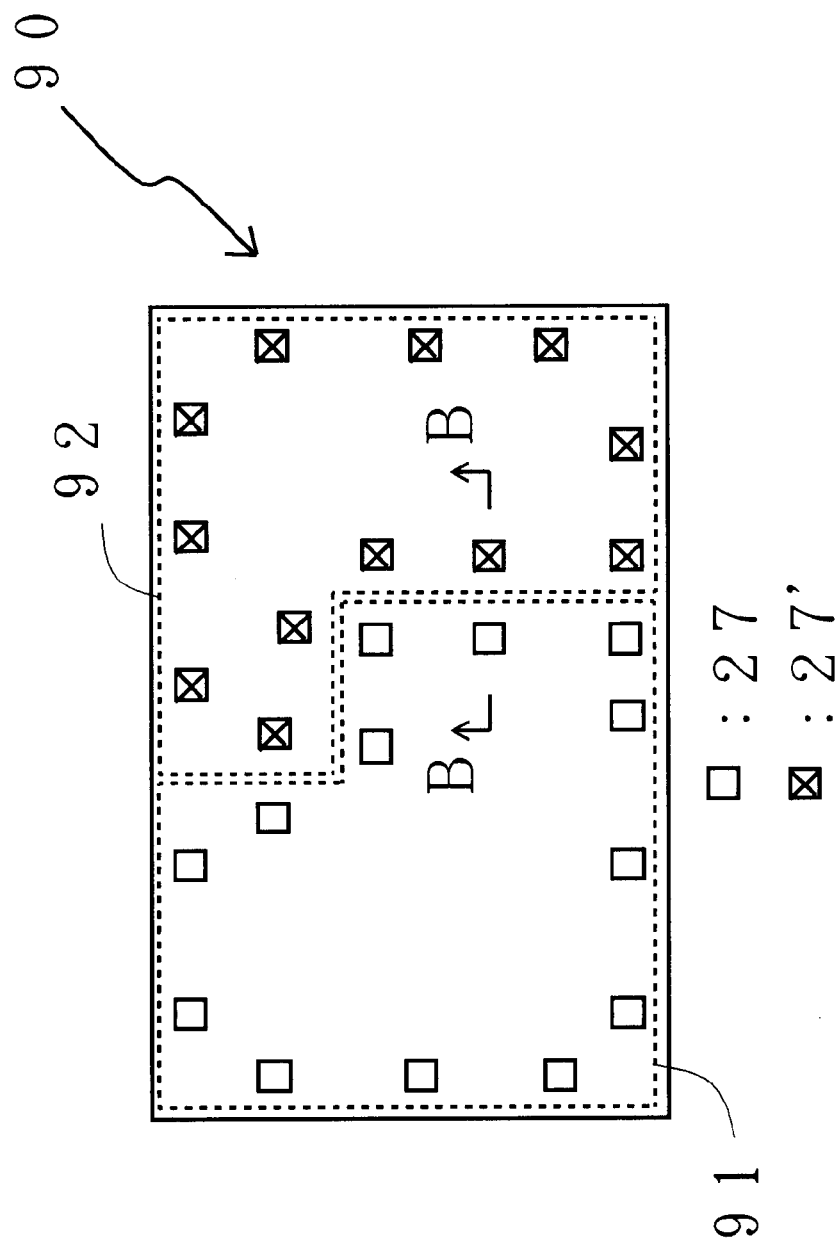
Figure 11B:
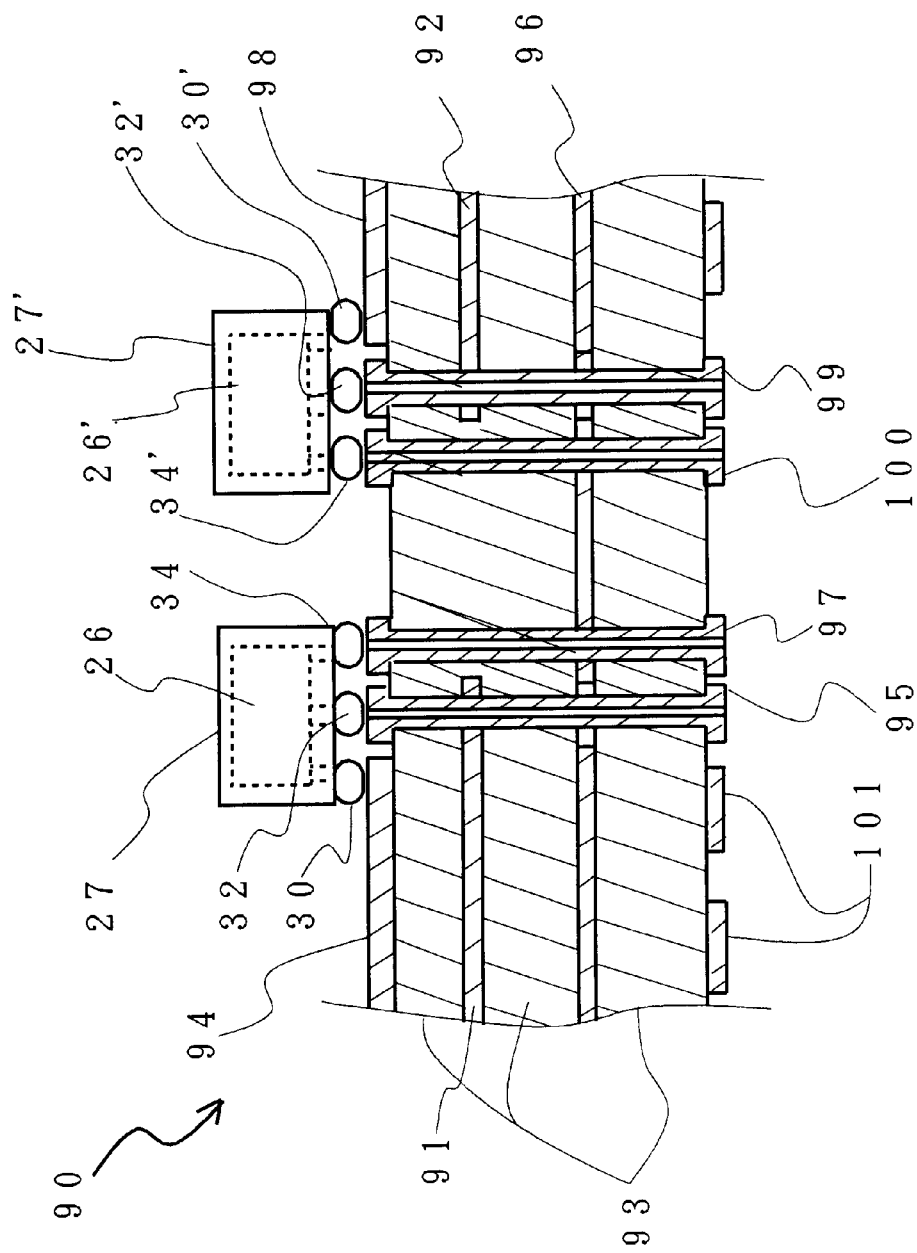
Figure 12:
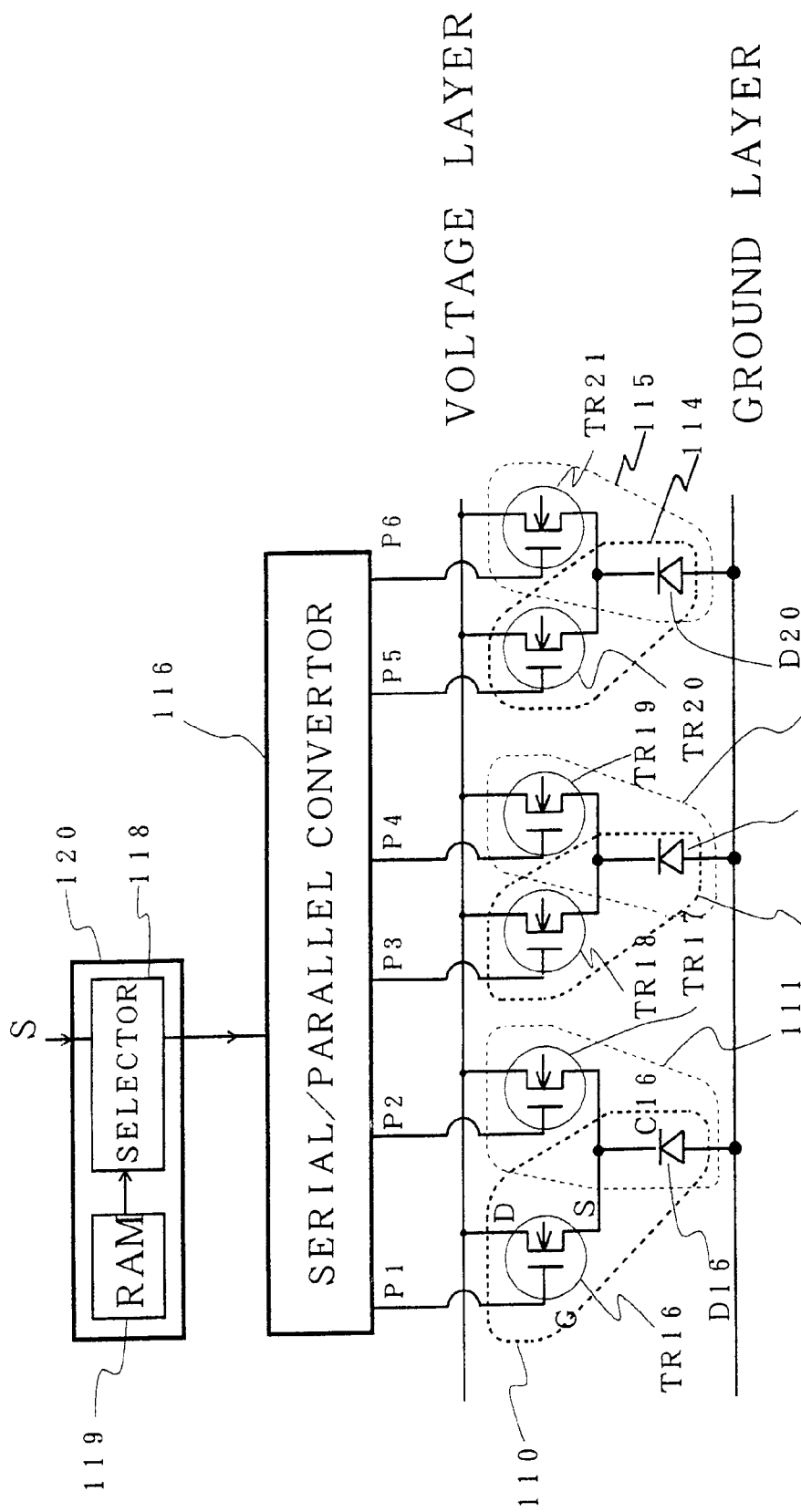
Figure 14:
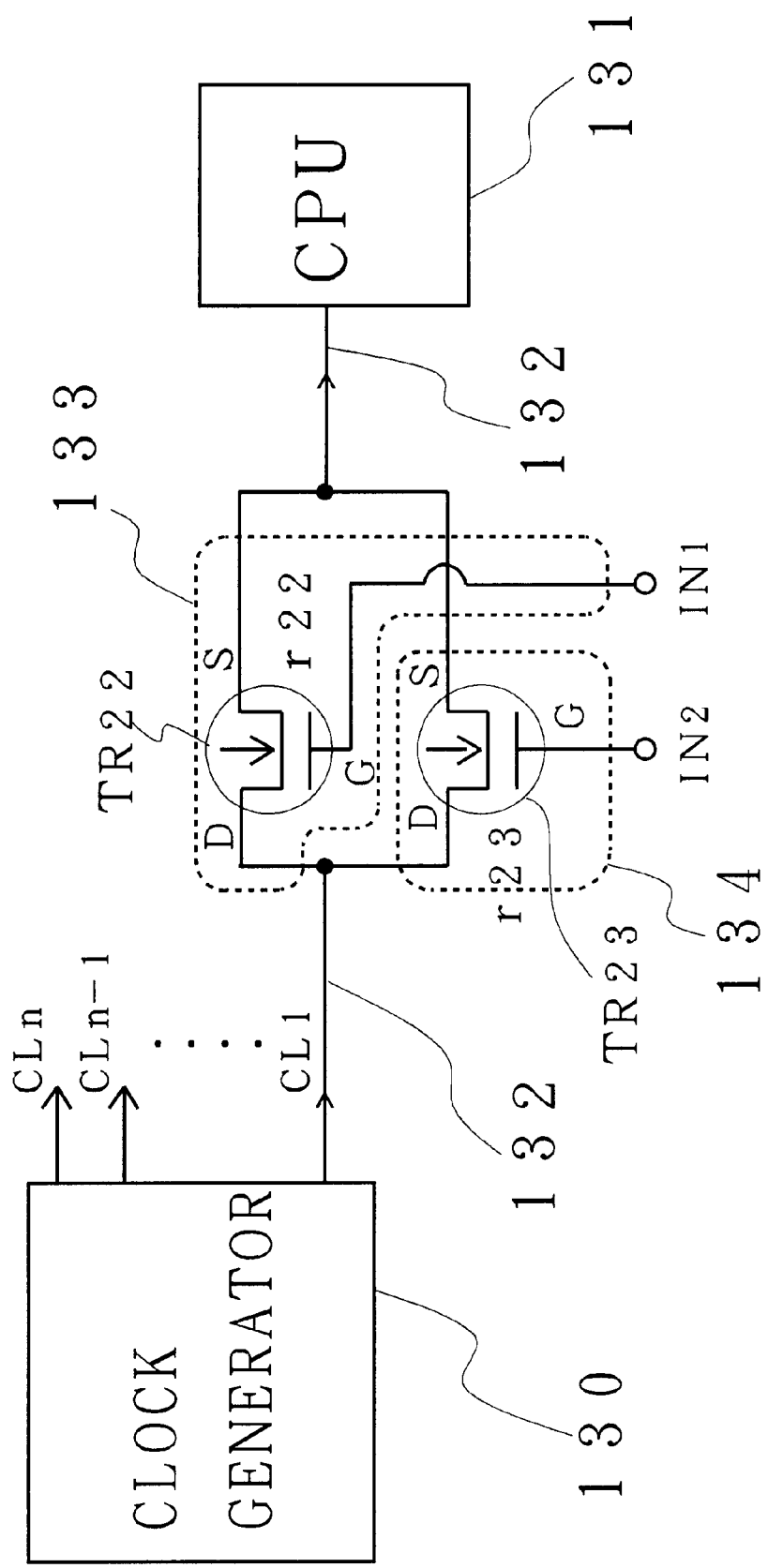
Figure 15:
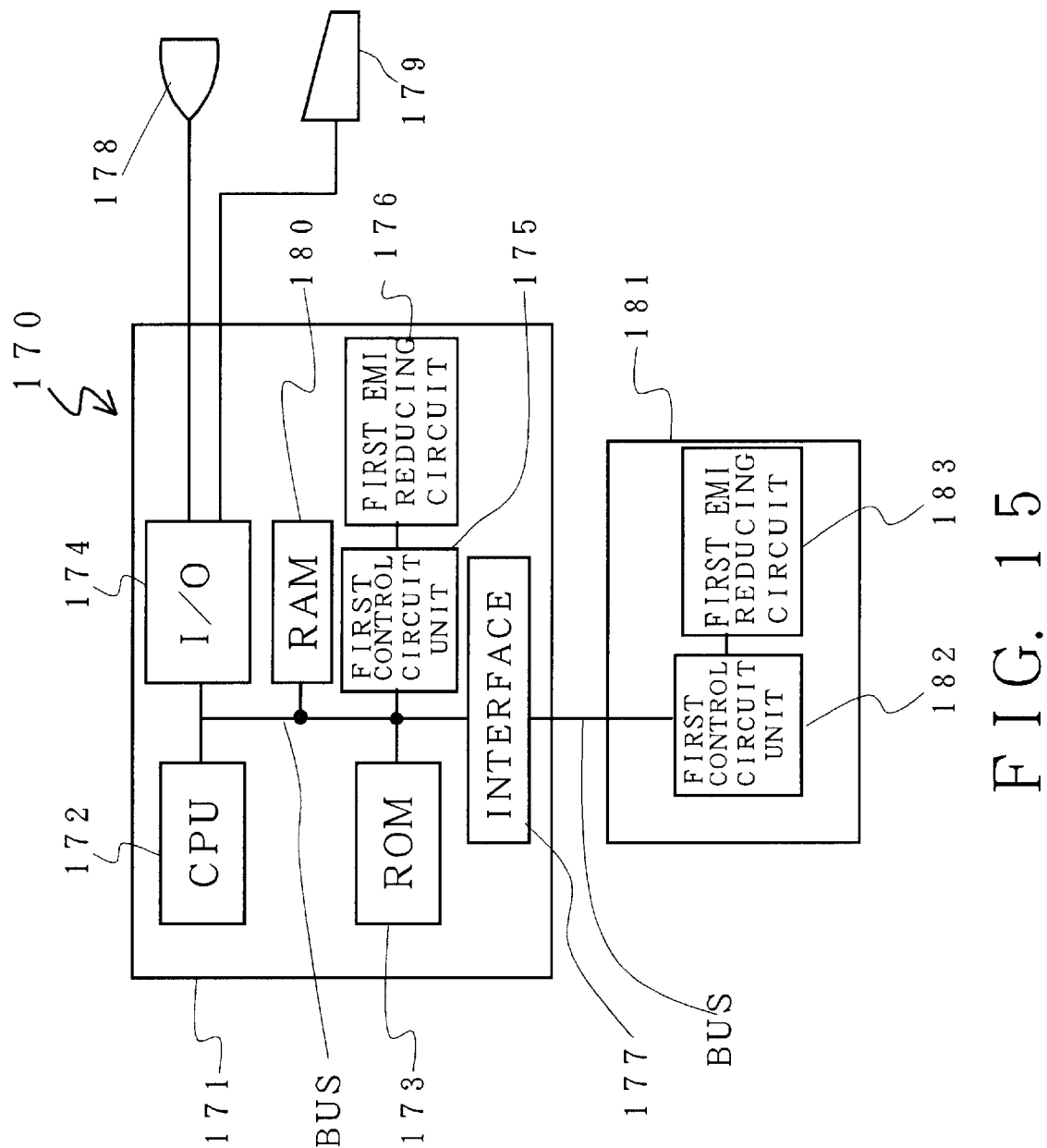
Figure 16:
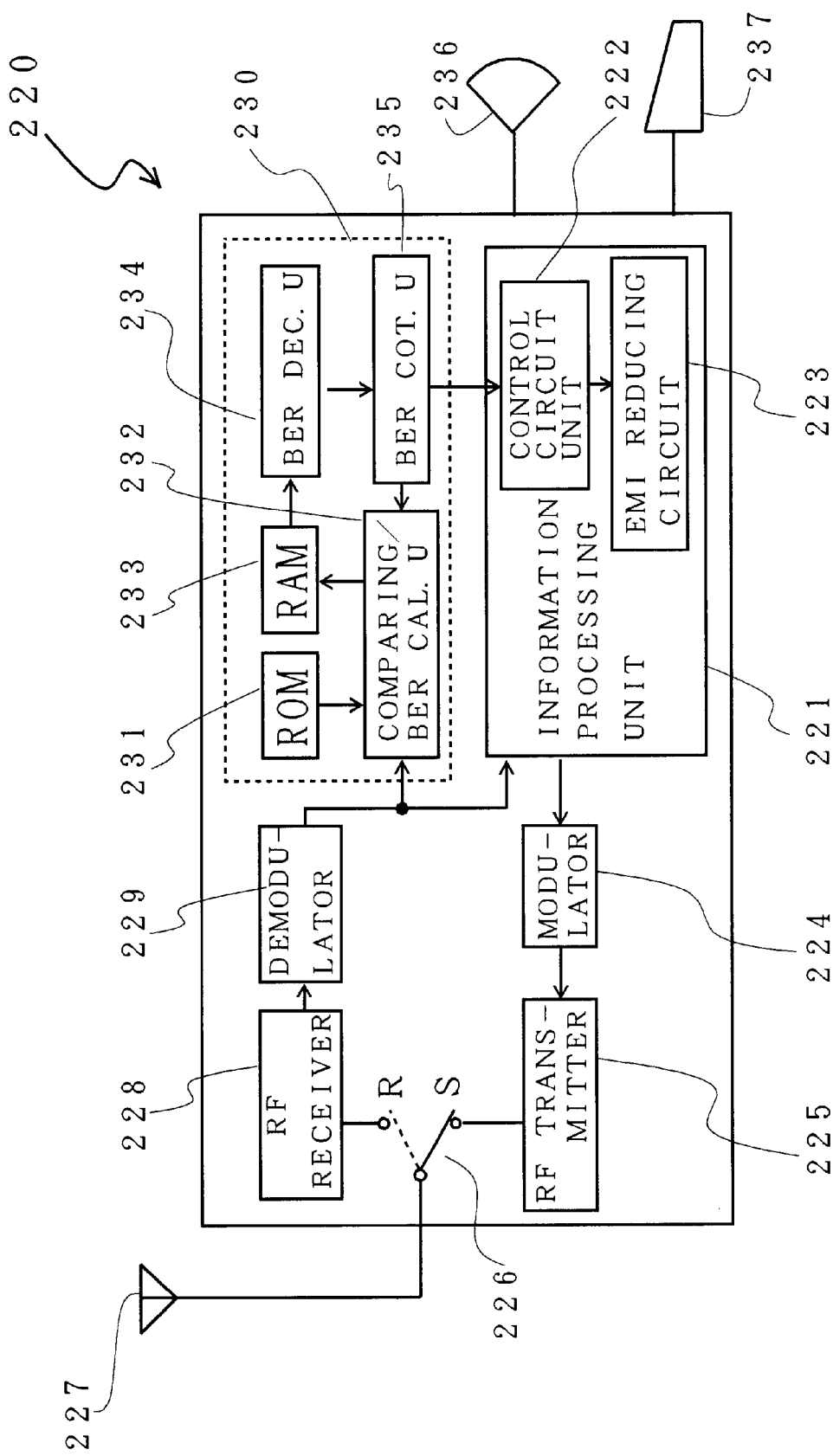
Figure 17:
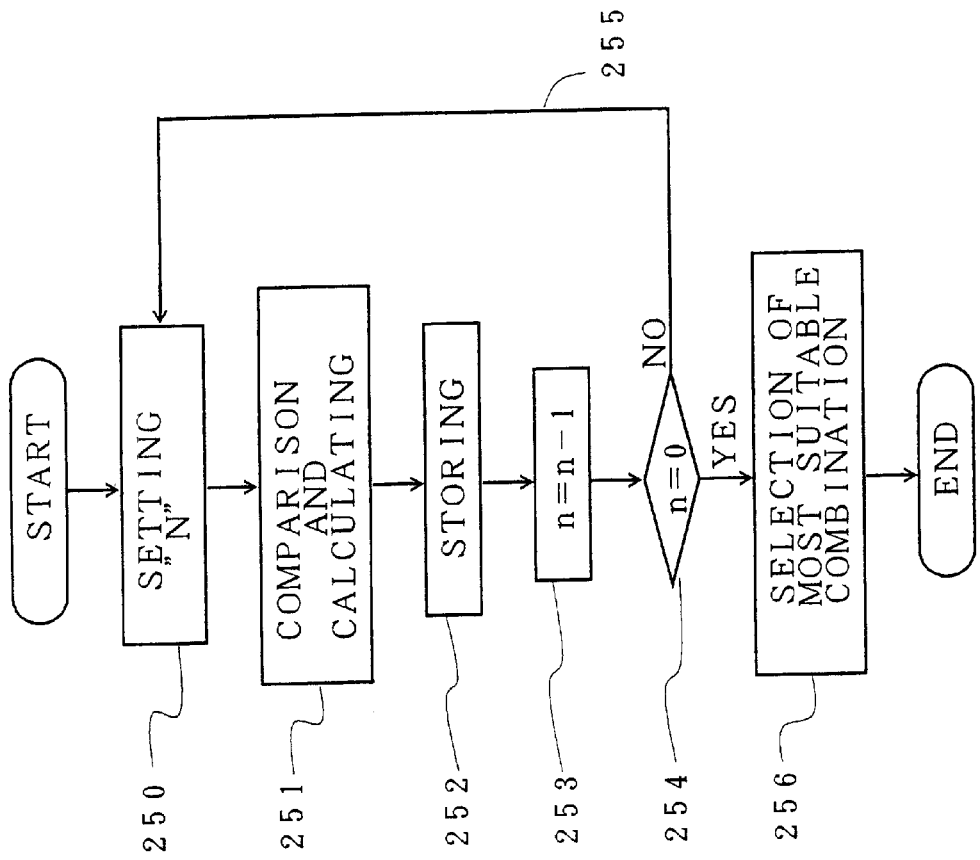
Figure 18:
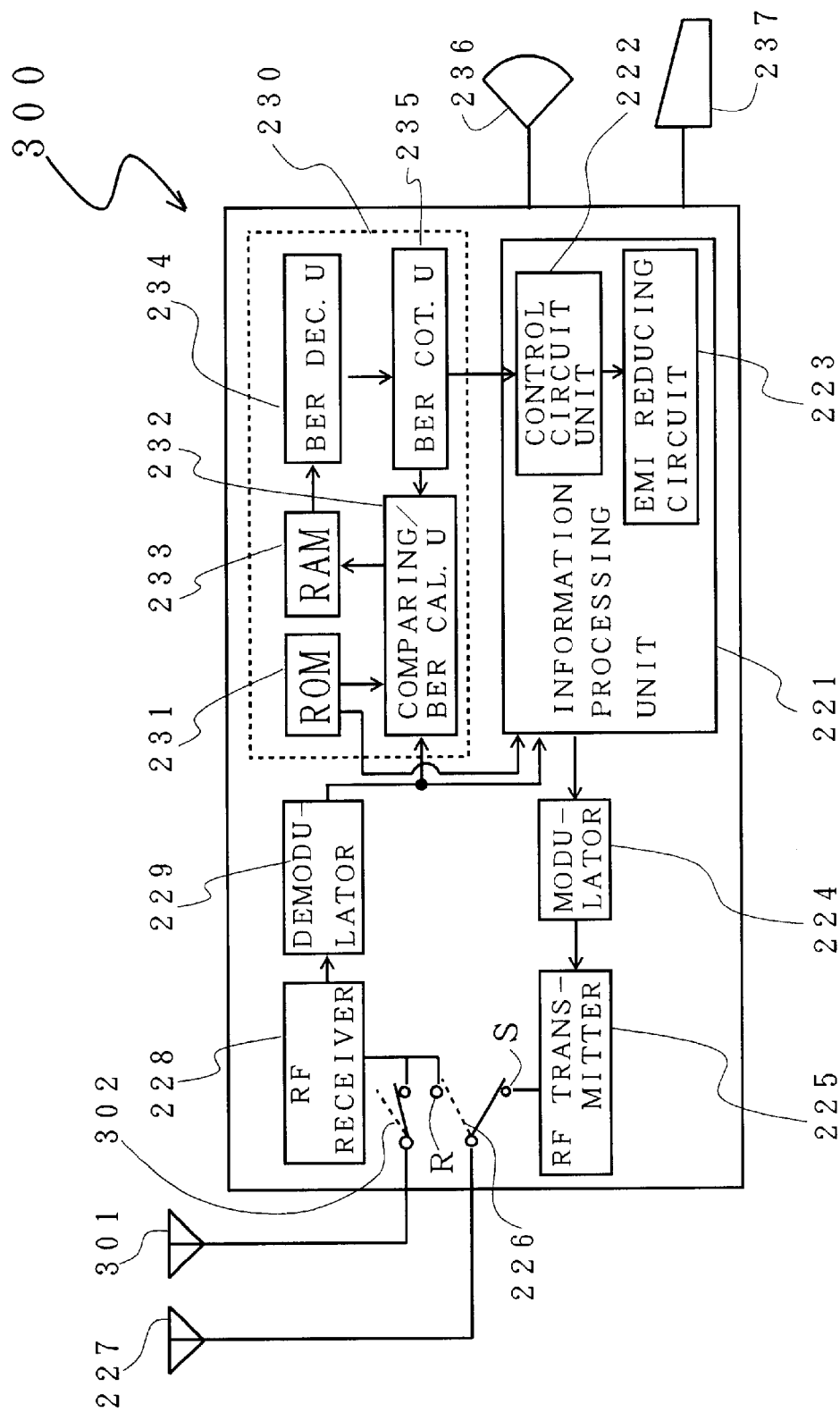
Figure 19:
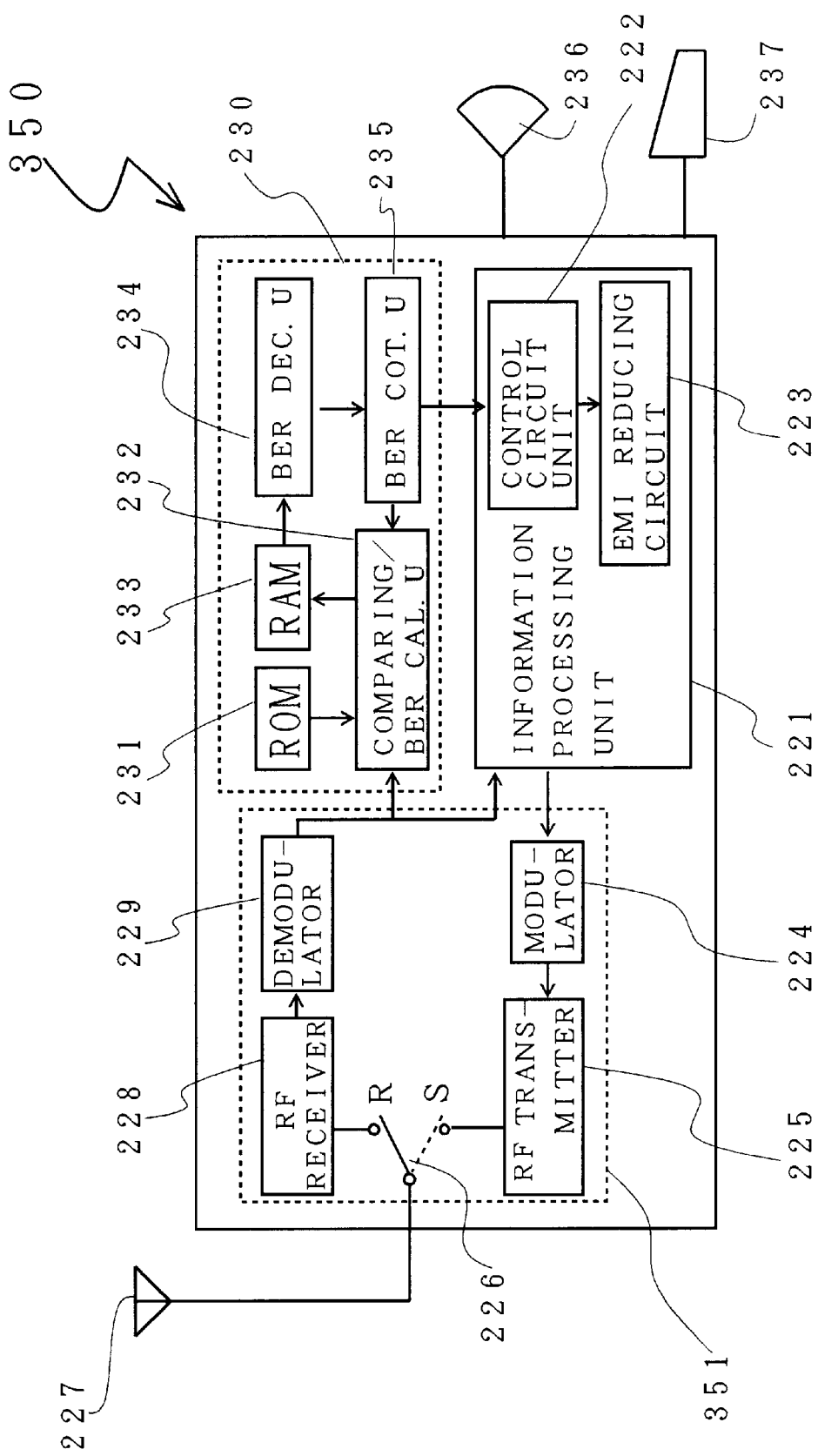

FIG. 1A and FIG. 1B are schematic diagrams of the present invention;

FIG. 2A and FIG. 2B schematically illustrate a first preferred embodiment of a printed circuit board in accordance with the present invention; and FIG. 2A is a top plane view of the board; and FIG. 2B is an enlarged section taken along an arrow line A—A of FIG. 2A;

FIG. 3 schematically illustrates a second preferred embodiment of a printed circuit board in accordance with the present invention;

FIG. 4 schematically illustrates a third preferred embodiment and shows a diagram of an EMI reducing circuit device mounted on the printed circuit board;

FIG. 5 schematically illustrates a fourth preferred embodiment and shows a diagram of an EMI reducing circuit on the printed circuit board;

FIG. 6 schematically illustrates a fifth preferred embodiment and shows a diagram of an EMI reducing circuit mounted on the printed circuit board;

FIG. 7 schematically illustrates a sixth preferred embodiment and shows a diagram of an EMI reducing circuit mounted on the printed circuit board;

FIG. 8 schematically illustrates a seventh preferred embodiment and shows a diagram of an EMI reducing circuit mounted on the printed circuit board;

FIG. 9 and FIG. 10 schematically illustrates a eighth preferred embodiment; and FIG. 9 shows a fragmentary detail of an EMI reducing circuit mounted on the printed circuit board; and FIG. 10 schematically illustrates a diagram of enlarged section taken along an arrow line D—D in FIG. 9;

FIG. 11A and FIG. 11B schematically illustrate a ninth preferred embodiment of a printed circuit board in accordance with the present invention; and FIG. 11A is a top plane view of the board and FIG. 11B is an enlarged section taken along an arrow line B—B of FIG. 11A;

FIG. 12 schematically illustrates a tenth preferred embodiment and shows a diagram of EMI reducing circuits;

FIG. 13 is a diagram of combination of control signals and circuit constants in the tenth preferred embodiment;

FIG. 14 schematically illustrates a diagram of an eleventh preferred embodiment of the present invention applied to a single signal line on a printed circuit board;

FIG. 15 schematically illustrates a twelfth preferred embodiment of an apparatus in accordance with the present invention;

FIG. 16 schematically illustrates a thirteenth preferred embodiment of an apparatus in accordance with the present invention;

FIG. 17 is a schematic flow chart to select a suitable combination of the EMI reducing circuits in an apparatus shown in FIG. 16;

FIG. 18 schematically illustrates a fourteenth preferred embodiment of an apparatus in accordance with the present invention; and FIG. 19 schematically illustrates a fifteenth preferred embodiment of an apparatus in accordance with the present invention.

DESCRIPTION OF THE PREFERRED EMBODIMENT

The principle of the present invention is described hereinafter referring to FIG. 1 where two types of EMI reducing circuit are shown. One of the types of the circuit includes a bypass circuit and a switching device as shown in FIG. 1A; and another of the types of the circuit includes a damping circuit and a switching device as shown in FIG. 1B. Referring to FIG. 1A showing a partly enlarged illustration of a multilayer printed circuit board 1, the multilayer printed circuit board 1 has a voltage layer 2 and a ground layer 3 on both surfaces of a insulating layer 4. An arrangement formed with these three layers is similar to an arrangement of a microstrip antenna for transmitting and receiving electromagnetic waves. To reduce the electromagnetic radiation emitted from this multilayer arrangement, a first EMI reducing circuit 5 comprises a capacitor C1 and a switching device SW1. A second EMI reducing circuit 6 comprises a capacitor C2, a resistor R2 and a switching device SW2. These EMI reducing circuits 5 and 6 are enabled and disabled by the switching devices SW1 and SW2, where to enable the circuits 5 and 6 means to electrically connect these circuits 5 and 6 between the voltage layer 2 and the ground layer 3; and to disable the circuits 5 and 6 means to disconnect these circuits 5 and 6 from the voltage layer 2 or the ground layer 3. The first and second circuits 5 and 6 are preferably connected to each border portion of the voltage layer 2 and the ground layer 3. In being enabled, each of the EMI reducing circuits 5 and 6 acts as a circuit including bypass capacitor C1 and C2 respectively, and a voltage oscillation between the voltage layer 2 and the ground layer 3 is reduced. Consequently, the electromagnetic radiation is reduced.

It is preferable to connect a resistance element in series with a capacitor, such as R2 shown in FIG. 1A, because the resistance element consumes energy caused by a current flowing.

Referring to FIG. 1B showing another simplified arrangement of the present invention applied to a signal line 7, EMI reducing circuit 10 and 11 have resistors R3 and R4 wired in series with switching devices SW3 and SW4 respectively, where the resistors R3 and R4 are selectively connected to circuits 8 and 9 by these switching devices SW3 and SW4 respectively. As abrupt variations in signals transmitted from the circuit 8 are eased by R3 and/or R4 connected by the switching devices SW4 and SW5; the electromagnetic radiation emitted from the signal line 7 is reduced.

The above mentioned prior art has a disadvantage in that the value of capacitors provided between the both layers 2 and 3 are constant and not changeable for the suitable value to minimize the EMI if specifications of other electronic components mounted on the PCB are modified.

On the contrary, the present invention provides a PCB which includes the EMI reducing circuits having suitable circuit constants, which are selected by the switching devices, such as SW1, SW2, SW3 and SW4. These switching devices are electrically connected in series with the bypass capacitors C1 and C2, and the damping resistors R1 and R2 respectively. Therefore, in the present invention the switching devices make it possible for the EMI reducing circuits to have suitable circuit constants if specifications of other electronic components mounted on the PCB are modified.

For example, in the arrangement shown in FIG. 1A the capacitance is selected out of C1, C2, C1+C2, and in FIG. 1B the resistance is selected out of R3, R4, R3R4/(R3+R4).

Referring to FIG. 2 to FIG. 14, preferred embodiments of EMI reducing circuits are fully shown in accordance with the present invention. Preferred embodiments shown in FIG. 2 to FIG. 13 are related to the bypass-type EMI reducing circuit; and a preferred embodiment shown in FIG. 14 is related to a damping-type EMI reducing circuit.

FIG. 2 is a first preferred embodiment of the present invention and FIG. 2A schematically illustrates a top plane view of a PCB 20. FIG. 2B shows a detail of connections of a EMI reducing circuit 26 arranged in a EMI reducing unit 27 to a voltage layer 22 and to a ground layer 23. The EMI reducing circuit 26 is shown hereinafter as preferred embodiments.

In FIG. 2B, the PCB 20 is a multilayer printed-circuit board composed of three insulating layers 21, the voltage layer 22, the ground layer 23, and conductive patterns 24 and 25 as outmost layers for mounting circuit components and forming signal lines. The voltage layer 22 and the ground layer 23 are composed with an electrical conductive plane respectively. The present invention is applicable to other PCB which has an other number of layers.

In FIG. 2A, the circuit components mounted on the PCB 20 are not shown to make the first preferred embodiment clear except ones related directly to the invention.

A plurality of EMI reducing units 27 are mounted along the boarder of the PCB 20, where each of the EMI reducing circuits 26 is included in the EMI reducing unit 27. These EMI reducing units 27 are connected to a control circuit unit 28 with conductive patterns 24. An upper control unit (not shown in FIG. 2) transmits selection-signals to the control circuit unit 28. The control circuit unit 28 transmits control signals in accordance with the selection-signals to each of the EMI reducing circuits 26 through conductive patterns 24. Then the switching devices in the EMI reducing circuits 26 are operated to be ON or OFF by the control signals.

The EMI reducing units 27 has three terminals; a first terminal 30 for receiving the control signal to operate the switching device in the EMI reducing circuit 26, a second terminal 32 and a third terminal 33 for connecting the circuit 26 between the voltage layer 22 and the ground layer 23. The first terminal 30 is connected to the conductive pattern 24, the second terminal 32 is connected via a through-hole 31 to the voltage layer 22, and the third terminal 34 is connected via a through-hole 33 to the ground layer 23.

While the EMI reducing circuit 26 in the EMI reducing unit 27 are electrically connected to the PCB 20 as above-mentioned via the terminals 30, 32, and 34 in the first preferred embodiment shown in FIG. 2B, the EMI reducing unit 27 may be electrically connected with lead wires or other arrangement suitable to the surface mounting instead of the manner of the first preferred embodiment. Still more, the EMI reducing unit 27 may be connected via a connector mounted on the PCB 20 to the PCB 20.

And still more, while the conductive patterns 24 and 25 are arranged on the outmost layers in the first embodiment, the conductive pattern 24 or 25 may be arranged on the intermediate layers.

FIG. 3 schematically shows a top view of a PCB 40 as a second preferred embodiment of the present invention for shortening a length of the conductive pattern 42 or for forming an area to mount other circuit components (not shown). In FIG. 3, the conductive pattern 42 and control circuit units 41 are similar to the conductive pattern 24 and the circuit control unit 28 in the first preferred embodiment shown in FIG. 2A respectively. The control circuit unit 41 may be divided into a number of smaller units and be located separately as shown in FIG. 3, where the control circuit unit 41 is composed with two smaller units and located so as to form a central area to mount other circuit components.

FIG. 4 schematically shows a third preferred embodiment of the present invention, where a single of EMI reducing circuit 50 is included in the EMI reducing unit 27. In the circuit 50, a MOS transistor TR5 is used as a switching device, a capacitor CS as a capacitive element, and a resistor R5 as a resistance element which converts a bypass current to heat.

A gate G of the MOS transistor TR5 is connected to the first terminal 30; a drain D to the second terminal 32; and a source S to the capacitor C5; and the resistor R5 to the third terminal 34, respectively.

Although the MOS transistor having high input impedance suitable to the EMI reducing circuit is preferable as switching device, bipolar transistors may be used as the switching devices.

In the third preferred embodiment shown in FIG. 4, as the MOS transistor is N-channel type, an electrical path between the drain D and the source S turns on when a high level control signal is input into the gate G. And then the EMI reducing circuit 50 results in being electrical connection between the voltage layer 22 and the ground layer 23 shown in FIG. 2B. That is, the EMI reducing circuit 50 is enabled, and the high frequency current, which causes EMI, flows from the voltage layer 22 to the ground layer 23. Therefore the EMI is reduced.

While the EMI reducing circuit 50 includes a pair of the capacitor C5 and the resistor R5 as shown in FIG. 4, the circuit 50 may comprise the MOS transistor TR5 and the capacitor C5. And the values of the capacitor C5 or the resistor R5 are not necessary to be equal in every EMI reducing circuit. A plurality of the EMI reducing units 27 is mounted on the border of the PCBs as shown in FIG. 2 and FIG. 3.

Still more, an essential part of an EMI reducing circuit 51 is shown in FIG. 5 as a fourth preferred embodiment of the present invention. In FIG. 5, the same elements are designated by similar numerals in FIG. 4. In the present embodiment, a two-state type relay RL is used as the switching device so as to open and close an electrical path in response to the control signals and to sustain the electrical path till the next control signal.

When the control signal from the control circuit unit (not shown) is input via the terminal 30 to the COIL of the relay RL at a state of a path S0–S1 being connected, the state is converted from S0–S1 connected to S0–S2 connected. That is, the EMI reducing circuit 51 is converted from an enabling state (S0–S1 connected) to a disabling state (S0–S2 connected). Adversely the state of the path S0–S2 being connected turns to the state of S0–S1 connected by inputting the control signal. Using the relay RL having the above-mentioned performance, a current to suspend the state of electrical path is unnecessary and effective to reduce a power consumption of the apparatus. As shown in FIG. 1A, the EMI reducing circuit 51 may comprise the relay RL and the capacitor C6 without the resistor R6.

Further still more, an essential part of EMI reducing circuits 52 and 53 is shown in FIG. 6 as a fifth preferred embodiment of the present invention. In FIG. 6, the same elements are designated by similar numerals in FIG. 4. In the fifth preferred embodiment, two EMI reducing circuits 52 and 53 are included in the EMI reducing unit 27. The EMI reducing circuit 52 comprises a MOS transistor TR7, a capacitor C7, and the resistor R7. The EMI reducing circuit 53 comprises a MOS transistor TR8, a capacitor C8, and the resistor R7. The resistor R7 is used in common to the both circuits 52 and 53 for miniaturizing the EMI reducing unit 27.

A gate G of the MOS transistor TR7 is connected to the first terminal 30; a drain D to the second terminal 32; and a source S to the capacitor C7; and the resistor R7 to the third terminal 34, respectively. In the same fashion shown in the EMI reducing circuit 53, a gate G of the MOS transistor TR8 is connected to the first terminal 30'; a drain D to the second terminal 32; and a source S to the capacitor C7; and the resistor R7 to the third terminal 34, respectively.

In the fifth preferred embodiment, although two conductive patterns 24 and 24' to transmit each of the control signals to control the MOS transistors TR7 and TR8 are necessary, this arrangement enables to select an EMI reducing circuit from four circuits which may have different circuit constants respectively. That is, the arrangement allows a more suitable selection of the EMI reducing circuit to reduce EMI. As shown in FIG. 1A, the EMI reducing circuits 52 and 53 may comprise the MOS transistors TR7 and TR8, and the capacitors C7 and C8 without the resistor 7.

An essential part of an EMI reducing circuit 60 is shown in FIG. 7 as a sixth preferred embodiment of the present invention. In the sixth embodiment, a MOS transistor TR9 is mounted in the control circuit unit 28 to miniaturizing a size of the EMI reducing unit 27. In FIG. 7, a drain D of the MOS transistor TR9 is connected to a terminal 61 of the control circuit unit 28; and the terminal 61 and the terminal 32 are electrically connected with a conductive pattern 63 formed on the PCB 20. In the same fashion above-mentioned, a source S of the MOS transistor TR9 is connected to a terminal 62; and the terminal 62 and the terminal 30 are electrically connected with the conductive pattern 24. And a capacitor C9 and a resistor R9 are arranged in series and connected between the terminals 30 and 34. A gate G of the MOS transistor TR9 is connected a circuit component (not shown) in the control unit 28. As shown in FIG. 1A, the EMI reducing circuit 60 may comprise the MOS transistor TR9 and the capacitor C9 without the resistor R9. An advantage of the sixth preferred embodiment is in that more number of the EMI reducing units 27 can be mounted on the border of the PCB 20, where electromagnetic radiation are easily emitted.

An essential part of seventh preferred embodiment of the present invention is shown in FIG. 8; and a manually operative switching device is mounted for diminishing a control circuit unit and increasing an area to mount other circuit components. In the present embodiment, four EMI reducing circuits 55, 56, 57, and 58 are arranged in the EMI reducing unit 27. A DIP switch having four switches SW10, SW11, SW12, and SW13, each of which operates independently, is mounted in each of the EMI reducing circuits 55, 56, 57, and 58. These switches SW10, SW11, SW12, and SW13 are connected to each of capacitors C10, C11, C12, and C13 respectively. A resistor R10 is used as a common resistance element of the EMI reducing circuits 55 and 56; and a resistor R12 is used as a common resistance element of the EMI reducing circuits 57 and 58. Instead of the DIP switch, it is possible to use other DIP switches having different number of switch or other mechanical switches, such as toggle switches. And it is preferable to use a small mechanical switch having many electrical contacts. As shown in FIG. 1A, the EMI reducing circuits may comprise DIP switch and the capacitors without the resistors.

An eighth preferred embodiment of the present invention is described hereinafter, using FIG. 9 and FIG. 10. In the eighth preferred embodiment, electroconductive resilient clips 71 are used as the switching devices. FIG. 9 shows an essential border portion of a PCB 70 of typical arrangement of the embodiment, where two EMI reducing circuits including the capacitors C14 and C15, the resistors R14 and R15, and the two resilient clips 71 are shown. FIG. 10 shows a cross-sectional cut view taken along line D—D looking in the direction of the appended arrows of FIG. 9. In FIG. 9 and FIG. 10, the capacitors C14 is connected via a conductive pattern 72 to the resistor R14 and the resistor R14 is connected to a ground layer 78 via a conductive pattern 74 (shown in FIG. 9) with a through-hole (not shown). And also another terminal of the capacitor C14 is connected via another through-hole 76 (shown in FIG. 10) to a conductive pattern 75.

The resilient clip 71 electrically connects these conductive patterns 75 and 77, which are formed on opposite outermost surfaces of a PCB 70 respectively. The conductive pattern 77 is electrically connected to a voltage layer 73 via a through-hole 79.

As described above, the resilient clip 71 connects the EMI reducing circuits to the voltage layer 73 and the ground layer 78: the EMI reducing circuit is enabled. On the contrary, when the resilient clip 71 is removed, the EMI reducing circuit is disabled. As the resilient clips 71 are removable from the PCB 70, the resilient clips 71 are used as the switching devices in the present embodiment.

Notches 80 which are U-shaped cut at edges of the PCB 70, as shown in FIG. 9, prevent the resilient clips 71 from carelessly being removed. The resilient clips 71 being easily produced have effects to lower the cost of the apparatus and electrical power consumption. As shown in FIG. 1A, the EMI reducing circuits of the eighth preferred embodiment may comprise the capacitors and the resilient clips without the resistors.

The ninth preferred embodiment of the present invention is schematically shown in FIG. 11A and FIG. 11B. Recently several kinds of power supply voltages are employed in a single PCB; therefore, several voltage layers are formed in the PCB. The ninth preferred embodiment provides a PCB where a plurality of EMI reducing circuits are connected to border portions of each conductive pattern of voltage layers.

In FIG. 11A shows a top view of a PCB 90 mounting a plurality of EMI reducing circuits 27 and 27'. The PCB 90 has a first voltage layer 91 and a second voltage layer 92. Both of the layers 91 and 92 are indicated with doted lines and are arranged in a position in the direction of thickness of the PCB 90. A plurality of the EMI reducing units 27 are mounted on and connected to the border portion of the first voltage layer 91; and a plurality of the EMI reducing units 27' are mounted on and connected to the border portion of the second voltage layer 92 hereinafter.

A control circuit unit, conductive patterns from the control circuit unit to the EMI reducing units 27 and 27', and other circuit components mounted on the PCB 90 are not shown in FIG. 11A for the sake of simplicity. FIG. 11B is an enlarged fragmentary sectional view taken along an arrow line B—B shown in FIG. 11A.

In FIG. 11B, although the PCB 90 in the ninth preferred embodiment has three insulating layers designated by the numeral 93, the present invention may be applicable to a PCB comprising an other number of layers.

A manner of electrical connection of the EMI reducing circuits 26 and 26' is like the connection in the first embodiment shown in FIG. 2B; and the connection is described hereinafter. The terminal 30 of the EMI reducing unit 27 is connected to a conductive pattern 94 so as to receive control signals from the control circuit unit (not shown). The terminal 32 is connected via a through-hole 95 to the first voltage layer 91. A terminal 34 is connected via a through-hole 97 to a ground layer 96. As the same manner of the above-mentioned connection of the EMI reducing unit 27, a terminal 30' of the EMI reducing unit 27' is connected to a conductive pattern 98; a terminal 32' is connected via a trough-hole 99 to the second voltage layer 92; a terminal 34' is connected via a through-hole 100 to the ground layer 96.

As the EMI reducing units 27 and 27' are mounted alongside each boarder portion of the first voltage layer 91 and the second voltage layer 92 respectively, the EMI emitted from the PCB 90 having a plurality of the voltage layers 91 and 92 is reduced too.

Though the PCB 90 has explanatorily two voltage layers 91 and 92, the present invention is applicable to PCB(s) having more than two voltage layers; and still more the present invention is applicable to a PCB having more than a single ground layer as the almost same fashion in the embodiment described above. Even still more, as the manner of connecting EMI reducing units via through-holes between voltage layers and a ground layer is described in the ninth embodiment, the present invention is applicable to a PCB having voltage layers or ground layers composed in different vertical locations along thickness of the PCB.

A tenth preferred embodiment of the present invention is described hereinafter. The tenth preferred embodiment concerns increasing a number of EMI reducing circuits mounted on a border portion of PCB(s). As described above, the gap between the voltage layer and the ground layer is one of sources from which the EMI is radiated; electrical connections of EMI reducing circuits to a border portion of the voltage layer and the ground layer result in effective reduction of the EMI. And still more, for reducing the EMI, it is effective to select a combination of suitable circuits out of ones having different circuit constant. Therefore, the EMI reducing circuits mounted in an EMI reducing unit preferably may have not equal circuit constant but different ones or different ones synthesized from equal circuit constants. The EMI reducing units composed as described above will effectively reduce EMI even if an adopted CPU has different operating frequency or higher clock signal.

The tenth preferred embodiment provides a PCB for the above purpose and is described in detail hereinafter referring to FIG. 12 and FIG. 13.

FIG. 12 shows a schematic diagram of an essential part of the tenth preferred embodiment. The EMI reducing circuits 110, 111, 112, 113, 114, and 115 are composed of six N channel MOS transistors, TR16, TR17, TR18, TR19, TR20, and TR21 and three diodes, D16, D18, and D20 respectively. Each of the MOS transistors TR16, . . . TR20, and TR21 performs both functions of a switching device and a resistor. The backward-biased diodes D16, D18, and D20 as shown in FIG. 12, perform function of a capacitor caused by capacitance between an anode and a cathode of each diodes D16, D18 and D20 respectively. The MOS transistor TRIG16, . . . TR20, and TR21 make circuit conductive when a high level signal is input to each of gates Gs of the MOS transistors; and the resistances between each of sources Ss and drains Ds perform resistors consuming a current flowing form a voltage to a ground layer. Each drain D of the MOS transistors TRiG, TR20, and TR21 are connected to the voltage layer, each source S to the ground layer, and each gate G to a serial/parallel converter 116.

Hereinafter is described how to select the EMI reducing circuits 110, 111, 112, 113, 114, and 115 to be connected between the voltage layer and the ground layer.

A selection signal S transmitted from an upper unit (not shown) is input to a selector 118 in a control circuit unit 120. Receiving the selection signal S, the selector 118 reads out data, for example (1 0 0 0 0 0), from a RAM 119, which stores a plural data of combination indicating which EMI reducing circuit is enabled or disabled.

The data (1 0 0 0 0 0) is transmitted to the serial/parallel converter 116 in a serial data form. The reason why the data (1 0 0 0 0 0) is transmitted in serial data is to reduce the number of signal lines from the control circuit unit 120 to the serial/parallel converter 116, which is preferably mounted nearby the EMI reducing circuits, and to allow area for mounting other circuit components. The serial data (1 0 0 0 0 0) is converted into the parallel data (1,0,0,0,0,0) in the serial/parallel converter 116. Each datum is accordingly transmitted to the each gate G as a control signal. In this example, the datum "1" means a high level signal, which makes the switching device close, that is, the EMI reducing circuit enable.

In FIG. 13, are shown the six combinations of the control signals P1, P2, P3, P4, P5, P6 and the circuit constants, that is, resistance and capacitance. For the simplicity, the control signals transmitted from the serial/parallel converter 116, and combinations of resistance and capacitance are shown out of the theoretical sixty-four combinations. As shown in FIG. 13, in the case of the combination (P1, P2, P3, - - - , P6) being (1, 0, 0, 0, 0, 0), the high level signal "1" is input to only the gate of MOS transistor TR16 and the path between the source S and the drain D of the MOS transistor TR16 is closed (conductive). Therefore the EMI reducing circuit has circuit constants of resistance R16 and capacitance C16, which shunt the voltage layer and the ground layer.

In the arrangement of the tenth preferred embodiment, the EMI reducing circuit is capable of being selected one of sixty four circuit constants; that is, it is possible to select the EMI reducing circuit suitable to reduce EMI out of the circuit having many different circuit constants.

And even more, as the MOS transistors TR16, TR17, TR18, TR19, TR20, and TR21 act as the switching devices, the EMI reducing circuits and the unit are possibly arranged small.

Referring now to FIG. 14, there is schematically shown an eleventh preferred embodiment of the present invention. The eleventh preferred embodiment is different from the embodiments described heretofore; and provides an EMI reducing circuit to reduce EMI emitted form a signal line transmitting high frequency signals.

As shown in FIG. 14, EMI reducing circuits 133 and 134 are connected between a clock generator 130 and a CPU 131.

Although the eleventh preferred embodiment may be applied to any signal line through which clock signals CLn, CLn-1, . . . , CL2 are transmitted in the present embodiment shown in FIG. 14, the EMI reducing circuits 133 and 134 are applied to only a single signal line 132 transmitting a cloak signal CL1.

The EMI reducing circuits 133 and 134 having MOS transistors TR22 and TR23 respectively are connected in series with the signal line 132 through drains Ds and sources Ss of the MOS transistor TR22 and TR23 respectively. The gates Gs of the MOS transistor TR22 and TR23 are connected to an unshown control circuit unit and receive the control signals IN1 and IN2 respectively. In the eleventh preferred embodiment, the MOS transistors TR22 and TR23 are N channel-type MOS transistors and the resistance values of between drain D and source S are r22 and r23 respectively. The MOS transistors TR22 and TR23 open or close the signal line 132 by a high or a low-level input signal into each gate G, and the resistance between drain D and source S acts as resistance for damping a high frequency signal in the signal line 132. The resistance values are selected according to the level of the control signal IN1 and IN2. In the eleventh preferred embodiment, the MOS transistors TR22 and TR23 perform both of the switching devices and the resistors.

While the embodiment shown in FIG. 14 is arranged with the two MOS transistors TR22 and TR23, bipolar transistors, relays, or mechanical switches, such as DIP switches and toggle switches, are also available as the switching devices. Carbon film resistors, metal film resistors, or thick film resistors are also available as resistors for damping.

In the third, the fifth, the sixth, the tenth, and the eleventh preferred embodiments, although the EMI reducing circuit comprises the MOS transistor as the switching device, a bipolar transistor may be applicable to the switching device.

From the descriptions in the first to the eleventh embodiments, it will be understood that the present invention has an advantage to enable the selection of the suitable combination of reducing circuits to reduce EMI even in case of changing circuit components mounted on PCBs.

And still more, the present invention has advantages to lower the cost of the apparatus and PCBs and to shorten a period of designing them, because of unnecessity of redesign and trial production to decide suitable circuit specifications in EMI reducing circuits.

In the description above, the electric switching devices such as the MOS transistors and relay are preferable, because of enabling a faster selection of a most suitable combination of EMI reducing circuits.

On the other hand, as mechanical switches described in the seventh and the eighth embodiments do not need the control circuit unit and conductive patterns to transmit control signals, the area on the PCBs for the unit and the patterns is allowed for other circuit components and the cost of the apparatus is lowered.

A twelfth embodiment of the present invention is shown in FIG. 15. FIG. 15 shows an information processing apparatus 170 having a plurality of first EMI reducing circuits 176 and a plurality of second EMI reducing circuits 183 thereon described above so as to reduce EMI emitted from the information processing apparatus 170. In FIG. 15, elements necessary to explain the essence of the present invention are shown, but typical elements of an information processing apparatus, such as a main memory, a disk unit, pointing devices are not shown.

In FIG. 15, the information processing apparatus 170 has a main PCB 171, a display unit 178, a keyboard 179, and an extended PCB 181. The first EMI reducing circuits 176 are mounted on the main PCB 171; and the second EMI reducing circuits 183 are mounted on the extended PCB 181 respectively.

On the main PCB 171 are mounted a CPU 172, a ROM 173, which stores a combination data of the first EMI reducing circuits 176 and the second EMI reducing circuit 183, a first control circuit unit 175 for controlling the first EMI reducing circuits 176, an I/O control unit 174 for controlling the display 178 and the keyboard 179, and a RAM 180 storing a plurality of measurements. And on the extended PCB 181 electrically connected through an interface unit 177 to Bus on the PCB 171 are mounted a plurality of EMI reducing circuits 183 and a second control circuit unit 182. In the information processing unit 170 arranged as shown in FIG. 15, the way of selecting the first EMI reducing circuit 176 and the second EMI reducing circuit 183 will be described hereinafter.

The data of combination of the first and the second EMI reducing circuits 176 and 183 to be enabled are stored in the ROM 173. A start command is input from the keyboard 179. At next step, the CPU 172 reads out a first combination data from a plurality of combination data stored in the ROM 173 in accordance with a predetermined sequence, and sends the combination data through bus lines to the first and the second control circuit units 175 and 182 respectively. The first and the second control circuit units 175 and 182 turn on the switching devices in the EMI reducing circuits 176 and 183 in accordance with the combination data respectively.

In this instance, on the display unit 178 the combination data or signs instead of the combination data, such as ID numbers, are displayed.

In the next step, the CPU 172 processes a program, which is predetermined for this EMI measurement, such as a computation of the ratio of the circumference of a circle to its diameter. During the computation, the measurement instruments (not shown) measure the EMI emitted from the apparatus 170. After the computation, the measured values are input with the keyboard 179, displayed on the display unit 178, and stored in the RAM 180. In this manner, the values corresponding to every stored combination data are taken by the measurement, displayed on the display unit 178, and stored in RAM 180.

After each measured values corresponding to all combination data is stored in RAM 180, the CPU 172 searches a minimum value in the measured values. And a combination data corresponding to the minimum value is sent to the first and the second control circuit unit 175 and 182 respectively; accordingly the corresponding a plurality of first and second EMI reducing circuits 176 and 183 are enabled respectively.

As instruments, circumstances and conditions of measurement of EMI emitted from an apparatus are well known, the descriptions related to these are not described.

In the twelfth preferred embodiment, though the measured values are manually inputted to the apparatus 170 through the keyboard 179, it is possible to automatically transmit the measured values from the measurement instruments via a cable to the apparatus 170 in order to shorten a time to determine the first and the second EMI reducing circuits 176 and 183 to be enabled.

As there is the possibility that the amount of EMI is depend on a program processed by the CPU 172, it is preferable to process a same program in every measurement.

As the twelfth preferred embodiment provides the information processing apparatus including PCBs mounting EMI reducing circuits thereon, which are selectively enabled, the apparatus is able to control the amount of EMI emitted from the apparatus itself.

A thirteenth preferred embodiment of the present invention is schematically shown in FIG. 16 and FIG. 17. FIG. 16 shows a block diagram of an information processing apparatus of the thirteenth preferred embodiment and FIG. 17 shows a flow chart for selecting the most suitable combination of EMI reducing circuits in the information processing apparatus. The thirteenth preferred embodiment provides an information processing apparatus 220 having a wireless interface and a PCB with EMI reducing circuits 223.

FIG. 16 shows elements necessary for an understanding of the thirteenth preferred embodiment. A display unit 236 and a keyboard 237 are connected to the apparatus 220 as I/O devices. In the apparatus 220, an information-processing unit 221 comprises the PCB, on which EMI reducing circuits 223 and a control circuit unit 222 are mounted.

In case of transmitting the data from the information processing apparatus 220 to other facilities, the data processed in the information-processing unit 221 is sent to a modulator 224 where the data is mixed with carrier. And the modulated data is sent to a RF (Radio Frequency) transmitter 225, and then sent to an antenna 227 through a switch 226 and radiated, where the switch 226 is turned to "S" as shown in FIG. 16. Conversely in case of receiving data from other facilities, the data received by the antenna 227 is input to a RF receiver 228 through the switch 226, where the switch 226 is turned to "R".

By the RF receiver 228 and a demodulator 229, the data is detected, amplified and converted into signals in a digital form, and then input into the information processing unit 221. In this manner the information processing apparatus 220 is capable of transmitting and receiving data to/from other facilities.

In the apparatus 220, a manner of adjusting EMI reducing circuits 223, which may have equal or different circuit constants, to be enabled is described hereinafter in detail.

The essential part is a comparing unit 230, which compares the received data with an original data, which is described in detail hereinafter. That is, the comparison between a received data and the original data is performed at every predetermined combination of the EMI reducing circuits 223 to be enabled at a same time. By the comparison, the combination which gives minimum bit error rate is selected as a preferable one.

Now the original data is explained. Generally in data transmission, data are composed with a predetermined format. And some parts in the format are assigned to specific data which have specific number of digit located at predetermined position in the format. As these parts previously known, it is possible to store the data of these parts in storage devices. The data which are previously known and are compared with received data are designated "original data." The original data may be composed in a fixed position at a user data area in the predetermined format.

Referring to FIG. 16 and FIG. 17, a BER (Bit Error Rate) control unit 235 sends a selection signal which designates the first combination of EMI reducing circuit 223 to a control circuit unit 222 (Step 250 in FIG. 17).

Corresponding to the selecting signal, the control circuit unit 222 enables the EMI reducing circuits 223 designated by the first combination. After enabling the designated EMI reducing circuits 223, the apparatus 220 starts to receive data and the received signals are input via the RF receiver 228 and the demodulator 229 into a comparing/BER calculating unit 232 as in the form of digital data.

In the comparing/BER-calculating unit 232, a gate (not shown) samples the received data in the unit 232 and the part corresponding to the original data is extracted from the received data. Then, data in the part is compared with the original data read out from a ROM 231 storing the original data.

BER is calculated in the comparing/BER calculating unit 232 (Step 251 in FIG. 17), and the BER is sent to and stored in a RAM 233 (Step 252 in FIG. 17). On the next step, a BER circuit control unit 235 checks whether every combination of EMI reducing circuit 223 is selected or not (Step 253, 254, 255 in FIG. 17). The above-mentioned calculation of BER is continued to the end of predetermined combination and every BER corresponding to each of the combination is stored in the RAM 233.

After the BERs to all combination are stored in the RAM 233, the all BERs are sent to a BER decision unit 234, in which the combination resulting in a minimum BER is searched (Step 256 in FIG. 17).

The selecting signal indicating the searched combination is sent from the BER circuit control unit 235 to the control circuit unit 222 and the EMI reducing circuits 223 are enabled by the control signal from the unit 222.

In the thirteenth preferred embodiment, the switching devices used in EMI reducing circuits 223 are preferably MOS transistors, relays, or bipolar transistors. The reason why these devices are preferable is a faster operation than an operation with other mechanical switching devices.

While the selecting process described above can be performed any time, it is preferable to perform at the time of switch-on of the apparatus, the power-supply or at predetermined time-spaced intervals. Particularly the predetermined time-spaced interval selecting process prevents adversely affecting from the variation of circuit components characteristics by the temperature and aging.

The thirteenth preferred embodiment provides the means for reducing the EMI emitted from the apparatus to the minimum level of the EMI by adjusting the EMI reducing circuits to be enabled.

And still more, the thirteenth preferred embodiment provides the means capable of calculating the bit error rate without expensive measuring instruments so that the apparatus 220 operates in the minimum level of the EMI within the limits of the possible.

A fourteenth preferred embodiment of the present invention is schematically shown in FIG. 18. In FIG. 18, the same ones are designated by similar numerals in FIG. 16. A numeral 300 designates an information processing apparatus having wireless interface. The apparatus 300 has a receiving antenna 301. Signals received by the receiving antenna 301 are input via a switch 302 to the RF receiver 228. When the switch 226 turns to "S" as that the switch 302 remains closed, the data stored in the ROM 231 are read out and the data are transmitted from the antenna 227 via the information processing unit 221, the modulator 224, and the RF transmitter 225. The receiving antenna 301 receives the signals emitted from the antenna 227. As the received signals are originally generated by the data stored in the ROM 231, the data stored in the ROM 231 are used as the original data.

A comparison the received data with the original data, a calculation of the error rate, and a selection of the suitable combination of the EMI reducing circuits 223 are done in the same manner as described in the thirteenth preferred embodiment. As the apparatus 300 provided by the thirteenth preferred embodiment has the antenna 227 and the receiving antenna 301, the most suitable combination of EMI reducing circuits 223 can be selected even when there is no signal transmitted by other facilities or original data are not known. Still more, since the BER is measured by the signal transmitted form the apparatus 300 itself, it is possible to select the most suitable combination of EMI reducing circuits without long-time work for measurement and expensive measurement instruments. The combination of EMI reducing circuits to be enabled is selected so that the combination can give the minimum BER calculated in the comparing unit 230.

Without the comparing unit 230 or without operating of the comparing unit 230, the information processing apparatus 220 in the thirteenth preferred embodiment and the information processing apparatus 300 in the fourteenth preferred embodiment can perform to reduce the EMI using the procedure of selection of the suitable combination of the EMI reducing circuits as the same manner described in the twelfth preferred embodiment.

A fifteenth preferred embodiment is shown in FIG. 19. In FIG. 19, the same elements are designated by similar numerals in FIG. 16. The numeral 350 refers to a mobile terminal, such as a mobile computer, a notebook computer and a laptop computer, which is easy to be carried. The mobile terminal 350 can include a wireless communication device, which is preferably accommodated in a PCMCIA (Personal Computer Memory Card International Association) printed circuit card 351 designated by doted line in FIG. 19. The antenna 227 is connected to the card 351, or mounted on the card 351.

The card 351 is attached and removed in the PCMCIA standard socket (not shown) provided at the mobile terminal 350. In the card 351 are included the modulator 224, the RF transmitter 225, the switch 226, the RF receiver 228, and the demodulator 229. The information-processing unit 221 has PCB(s), which includes CPU (not shown), other circuitry (not shown) for a computer composition, the EMI reducing circuits 223 connected to electrical conductive patterns formed on or in the PCB(s), and the control circuit unit 222 which generates signals for selective actuation of the switching devices.

The original data included in received signals are compared with the original data stored in the ROM 231. The combination of EMI reducing circuits 223, which makes the BER minimum, is searched in the comparing unit 230 in the same manner as described in the thirteenth and the fourteenth embodiments shown in FIG. 16 and FIG. 18 respectively. The EMI reducing circuits 223 in accordance with the most suitable combination are enabled by closing the switching devices selected by the signal from the control circuit unit 222. In the fifteenth preferred embodiment, the EMI reducing circuits which are shown in FIG. 4, FIG. 5, FIG. 6, FIG. 7, and FIG. 12 are preferably applied to the EMI reducing circuits 223. Although the fifteenth preferred embodiment has a detachable wireless communication device, the present invention may be applied to a mobile terminal having a wireless communication device arranged on a PCB coupled to the terminal.

The fifteenth preferred embodiment provides the mobile terminal, capable of communicating with a wireless interface, with means for reducing EMI. Using the means, the mobile terminal can communicate with other facilities in good condition.

The present invention may be embodied in the other specific forms without departing the sprit or essential characteristics thereof.

We claim:

1. A printed circuit board having a printed pattern, comprising:
   plurality of EMI reducing circuits arranged on said printed circuit board, each of said EMI reducing circuits including:
      a circuit element for decreasing electromagnetic radiation from said printed circuit board, and
      a switching device selectively connecting said circuit element to a portion of said printed circuit pattern for enabling and disabling said circuit element;
   a memory device for storing information of a plurality of predetermined combination of said EMI reducing circuits to be enabled and disabled; and
   a control unit for transmitting signals to said EMI reducing circuits for opening and closing said switching devices corresponding to said information.

2. A printed circuit board having a printed circuit pattern, comprising:
   a plurality of EMI reducing circuits arranged on said printed circuit board, each of said EMI reducing circuits including:
      a circuit element for decreasing electromagnetic radiation from said printed board, and
      a switching device selectively connecting said circuit element to a portion of said printed circuit pattern for enabling and disabling said circuit element;
   a wireless communication means;
   a data storing device for storing an original data;
   a comparing unit for comparing said original data with a data received by said wireless communication means, and for outputting a data indicating a difference resulting from said comparing; and
   means for deciding said EMI reducing circuits to be enabled in accordance with said data indicating the difference.

3. An apparatus including a printed circuit board according to claim 1 further comprising:
   a wireless communication means;
   a storing device for storing an original data;
   a comparing unit for comparing said original data with a data received by said wireless communication means, and for outputting a data indicating a difference resulting from said comparing; and
   means for selecting a data indicating a minimum difference out of a plurality of said data indicating the difference corresponding to each of said combination stored in said memory device, and for transmitting a data of said combination providing in said minimum difference to said control unit.

4. The apparatus according to claim 3, wherein said apparatus further comprises:
   a receiver having a receiving antenna, and sending signals received by said receiving antenna to said comparing unit; and
   wherein said wireless communication means emits signals including said original data; said receiver receives said signals and sends said signals to said comparing unit, and said comparing unit compares said original data with a data in said signal and outputs a data indicating a difference resulting from said comparing of said original data with said data.

5. A mobile terminal including a printed circuit board and a detachable wireless communication module comprising:
   said printed circuit board comprising a plurality of EMI reducing circuits, said EMI reducing circuit including a switching device for enabling and disabling said EMI reducing circuit;
   a memory device for storing information of a plurality of predetermined combination of said EMI reducing circuits to be enabled and disabled;
   a control unit for transmitting signals for opening and closing said switching devices to said EMI reducing circuits corresponding to said information;
   a data storing device for storing an original data;
   a comparing unit for comparing said original data with a data received by said detachable wireless communication means, and outputting a data indicating a difference resulting from said comparison; and
   means for selecting a data indicating a minimum difference out of a plurality of said data indicating the difference corresponding to each of said combination stored in said memory device, and for transmitting a data of said combination resulting in said minimum difference to said control unit.

6. A method for selecting EMI reducing circuits according to claim 1, said method comprising the steps of:

composing a plurality of combination of said EMI reducing circuits to be enabled and disabled;

performing an information processing in enabling said EMI reducing circuits in each of said combination;

measuring electromagnetic radiation emitted from said printed circuit board in performing said information processing;

selecting a minimum amount out of amounts of said electromagnetic radiation;

deciding a combination of EMI reducing circuits providing said minimum amount; and enabling said combination of said EMI reducing circuits.

7. The method according to claim 6, wherein said comparing step further comprises steps of:

comparing a datum affected by said electromagnetic radiation with a true datum of said affected datum; and calculating an amount indicating a difference between said data.

8. A method for selecting EMI reducing circuits according to claim 5, said method comprising the steps of:

composing a plurality of combination of said EMI reducing circuits to be enabled and disabled;

performing an information processing in enabling said EMI reducing circuits in each of said combination;

measuring electromagnetic radiation emitted from said printed circuit board in performing said information processing;

selecting a minimum amount out of amounts of said electromagnetic radiation;

deciding a combination of EMI reducing circuits providing said minimum amount; and enabling said combination of said EMI reducing circuits.

* * * * *

UNITED STATES PATENT AND TRADEMARK OFFICE
CERTIFICATE OF CORRECTION

PATENT NO. : 6,580,931 B1
DATED : June 17, 2003
INVENTOR(S) : Shinichi Shiotsu

It is certified that error appears in the above-identified patent and that said Letters Patent is hereby corrected as shown below:

<u>Column 16,</u>
Line 7, after "printed" insert -- circuit --.

Signed and Sealed this

Fourth Day of November, 2003

JAMES E. ROGAN
*Director of the United States Patent and Trademark Office*